US012812999B2

(12) United States Patent
Yoo et al.

(10) Patent No.: US 12,812,999 B2
(45) Date of Patent: Nov. 24, 2026

(54) IMAGE SENSOR AND METHOD OF MANUFACTURING THE SAME

(71) Applicant: SAMSUNG ELECTRONICS CO., LTD., Suwon-si (KR)

(72) Inventors: Jaesang Yoo, Suwon-si (KR); Seungjoon Lee, Suwon-si (KR); Jeongki Kim, Suwon-si (KR); Chungho Song, Suwon-si (KR); Minwook Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 404 days.

(21) Appl. No.: 18/406,918

(22) Filed: Jan. 8, 2024

(65) Prior Publication Data

US 2024/0395842 A1 Nov. 28, 2024

(30) Foreign Application Priority Data

May 26, 2023 (KR) ........................ 10-2023-0068600

(51) Int. Cl.
*H10F 39/00* (2025.01)

(52) U.S. Cl.
CPC ......... *H10F 39/807* (2025.01); *H10F 39/011* (2025.01); *H10F 39/8063* (2025.01); *H10F 39/811* (2025.01)

(58) Field of Classification Search
CPC .. H10F 39/807; H10F 39/011; H10F 39/8063; H10F 39/811; H10F 39/199; H10F 39/8053; H10F 39/014; H10F 39/024; H10F 39/18; H10F 39/805; H10F 39/809
See application file for complete search history.

(56) References Cited

U.S. PATENT DOCUMENTS

| | | | | |
|---|---|---|---|---|
| 9,385,156 | B2 | 7/2016 | Tsai et al. | |
| 9,819,846 | B2 | 11/2017 | Masuda et al. | |
| 10,008,530 | B2 | 6/2018 | Liao et al. | |
| 11,024,659 | B2 | 6/2021 | Hur et al. | |
| 11,152,415 | B2 | 10/2021 | Lim et al. | |
| 2020/0077055 | A1* | 3/2020 | Kim | H10F 39/8023 |
| 2020/0127025 | A1* | 4/2020 | Lim | H04N 25/79 |
| 2020/0219912 | A1* | 7/2020 | Ro | H10F 39/811 |
| 2023/0029820 | A1 | 2/2023 | Tsai et al. | |

FOREIGN PATENT DOCUMENTS

| | | | |
|---|---|---|---|
| WO | 2022/249575 | A1 | 12/2022 |
| WO | 2022/270110 | A1 | 12/2022 |

* cited by examiner

*Primary Examiner* — Allison Bernstein
(74) *Attorney, Agent, or Firm* — Sughrue Mion, PLLC

(57) ABSTRACT

An image sensor includes a semiconductor substrate including pixels, a first surface, and a second surface opposite to the first surface. A trench isolation layer is provided in a trench penetrating the first surface and the second surface of the semiconductor substrate, and separating the pixels from each other. A micro lens is disposed on the second surface, wherein the trench isolation layer includes: a first conductive isolation layer extending from the first surface to the second surface. An insulation liner is disposed between the first conductive isolation layer and the semiconductor substrate. A second conductive isolation layer extends from the second surface to the first surface, the second conductive isolation layer being in contact with the first conductive isolation layer.

20 Claims, 23 Drawing Sheets

IMAGE SENSOR AND METHOD OF MANUFACTURING THE SAME

CROSS-REFERENCE TO RELATED APPLICATIONS

This application claims priority under 35 U.S.C. § 119 to Korean Patent Application No. 10-2023-0068600, filed on May 26, 2023, the disclosure of which is incorporated herein by reference in its entirety.

BACKGROUND

The present disclosure relates to an image sensor and a method of manufacturing the same.

An image sensor includes a plurality of pixels arranged in a two-dimensional array. Each pixel may include a photodiode (PD) as a photoelectric conversion element, and a trench isolation layer may be formed between photoelectric conversion elements to isolate photoelectric conversion elements from each other. The trench isolation layer may absorb a light depending on its material, and when the light is absorbed at a light incident portion of the trench isolation layer, an amount of the light incident to the photoelectric conversion elements may be reduced.

SUMMARY

One or more example embodiments provide an image sensor capable of reducing an optical loss and improving a photoelectric conversion efficiency.

According to an aspect of an example embodiment, an image sensor includes a semiconductor substrate including pixels, a first surface, and a second surface opposite to the first surface. A trench isolation layer is provided in a trench penetrating the first surface and the second surface of the semiconductor substrate, and separating the pixels from each other. A micro lens is disposed on the second surface, wherein the trench isolation layer includes: a first conductive isolation layer, an insulation liner, and a second conductive isolation layer. The insulation liner is disposed between the first conductive isolation layer and the semiconductor substrate. The second conductive isolation layer is in contact with the first conductive isolation layer and is disposed between the micro lens and the first conductive layer.

According to an aspect of an example embodiment, an image sensor includes: a first chip comprising a first semiconductor substrate including pixels and a trench isolation layer separating the pixels. A second chip stacked on the first chip with an adhesive portion is interposed between the first chip and the second chip, the second chip comprising a second semiconductor substrate, wherein the first semiconductor substrate comprises a first surface and a second surface opposite to the first surface, and the trench isolation layer is provided in a trench penetrating the first surface and the second surface of the first semiconductor substrate, the trench isolation layer comprising a first conductive isolation layer, an insulation liner disposed between the first conductive isolation layer and the first semiconductor substrate, and a second conductive isolation layer being in contact with the first conductive isolation layer and being disposed between the micro lens and the first conductive isolation layer.

According to an aspect of an example embodiment, a method of manufacturing an image sensor includes: forming pixels in a first semiconductor substrate, and forming a trench isolation layer in the first semiconductor substrate. The forming of the trench isolation layer includes: forming an insulation liner and a first conductive isolation layer in a trench penetrating a first surface and a second surface of the first semiconductor substrate, forming an insulating layer on the second surface, removing the insulating layer on the first conductive isolation layer, removing a portion of the first conductive isolation layer from the second surface to a point spaced apart from the second surface by a predetermined depth, forming a second conductive isolation layer on the second surface; and providing a micro lens on the second surface.

According to one or more example embodiments, a conductive isolation layer formed of a transparent conductive material is formed at a portion in a trench isolation layer, which is adjacent to a light incident surface, and thus, an optical loss is minimized.

Accordingly, a photoelectric conversion efficiency of an image sensor is improved, and a deterioration of the image sensor is prevented.

BRIEF DESCRIPTION OF DRAWINGS

The above and/or other aspects and features of the present disclosure will become apparent by describing in detail embodiments thereof with reference to the accompanying drawings.

DETAILED DESCRIPTION

Figure 1:
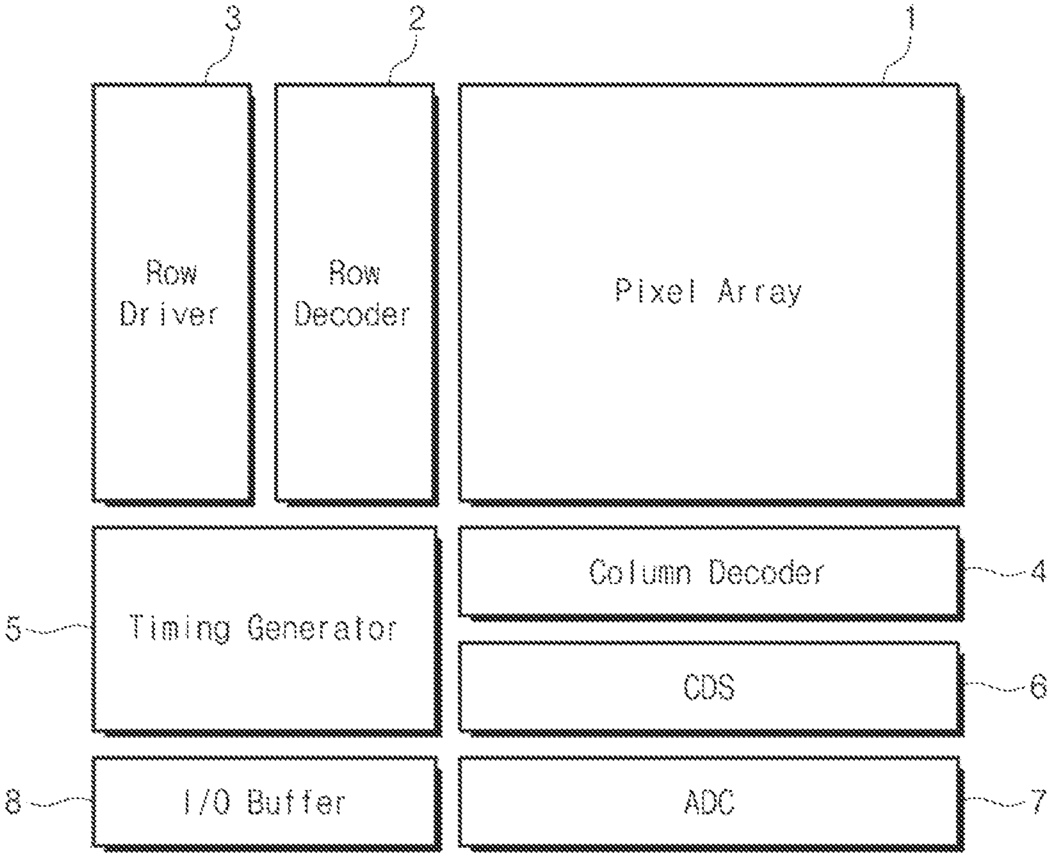
FIG. 1 is a block diagram illustrating an image sensor according to an example embodiment.

Hereinafter, example embodiments are described in conjunction with the accompanying drawings. Embodiments described herein are example embodiments, and thus, the present disclosure is not limited thereto, and may be realized in various other forms. Each example embodiment provided in the following description is not excluded from being associated with one or more features of another example or another example embodiment also provided herein or not provided herein but consistent with the present disclosure. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. It will be also understood that, even if a certain step or operation of manufacturing an apparatus or structure is described later than another step or operation, the step or operation may be performed later than the other step or operation unless the other step or operation is described as being performed after the step or operation.

Example embodiments of the present disclosure may be variously modified and realized in many different forms, and thus specific embodiments will be exemplified in the drawings and described in detail hereinbelow. However, the present disclosure should not be limited to the specific disclosed forms, and be construed to include all modifications, equivalents, or replacements included in the spirit and scope of the present disclosure.

FIG. 1 is a block diagram illustrating an image sensor according to an example embodiment.

Referring to FIG. 1, the image sensor may include a pixel array 1, a row decoder 2, a row driver 3, a column decoder 4, a timing generator 5, a correlated double sampler (CDS) 6, an analog-to-digital converter (ADC) 7, and an I/O buffer 8.

The pixel array 1 may include a plurality of pixels arranged in a two-dimensional array and may convert an optical signal into an electrical signal. The pixel array 1 may be driven in response to a plurality of driving signals, such as a pixel selection signal, a reset signal, and a charge transfer signal, from the row driver 3. In addition, the converted electrical signal may be provided to the correlated double sampler 6.

The row driver 3 may provide the driving signals to drive the pixels to the pixel array 1 according to a decoded result by the row decoder 2. In a case where the pixels are arranged in a matrix form, the driving signals may be provided for each row.

The timing generator 5 may provide a timing signal and a control signal to the row decoder 2 and the column decoder 4.

The correlated double sampler 6 may receive the electrical signal generated by the pixel array 1 and may hold and sample the electrical signal. The correlated double sampler 6 may double-sample a specific noise level and a signal level by an electrical signal and may output a difference level corresponding to a difference between the noise level and the signal level.

The analog-to-digital converter 7 may convert an analog signal corresponding to the difference level output from the correlated double sampler 6 into a digital signal and may output the digital signal.

The I/O buffer 8 may latch the digital signal and may sequentially output the latched signal to an image signal processor as the digital signal according to a decoded result by the column decoder 4.

Figure 2A:
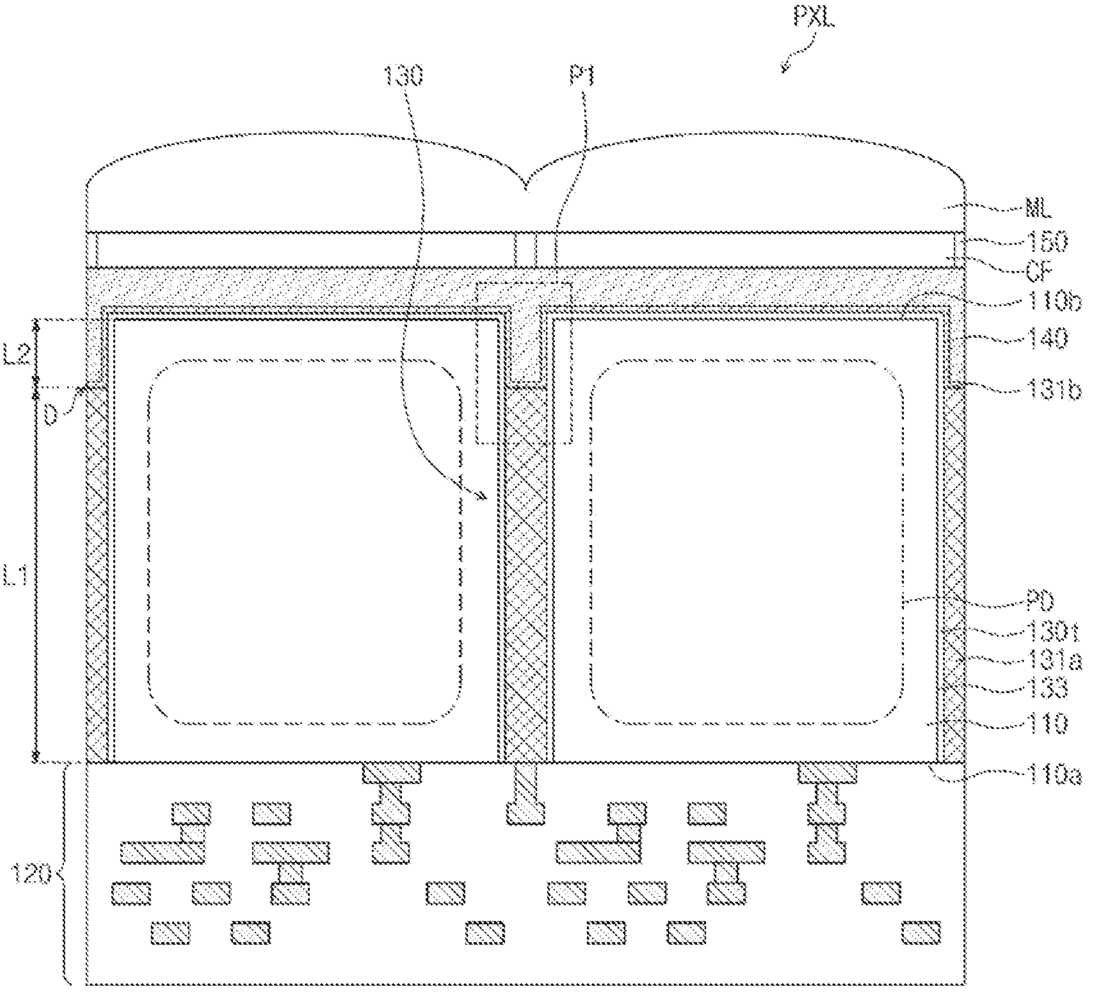
FIG. 2A is a cross-sectional view illustrating two pixels of a pixel array of the image sensor of FIG. 1, according to an example embodiment.

FIG. 2A is a cross-sectional view illustrating two pixels of the pixel array of the image sensor of FIG. 1, and FIGS. 2B to 2D are enlarged cross-sectional views illustrating a portion P1 of FIG. 2A.

Figure 2B:
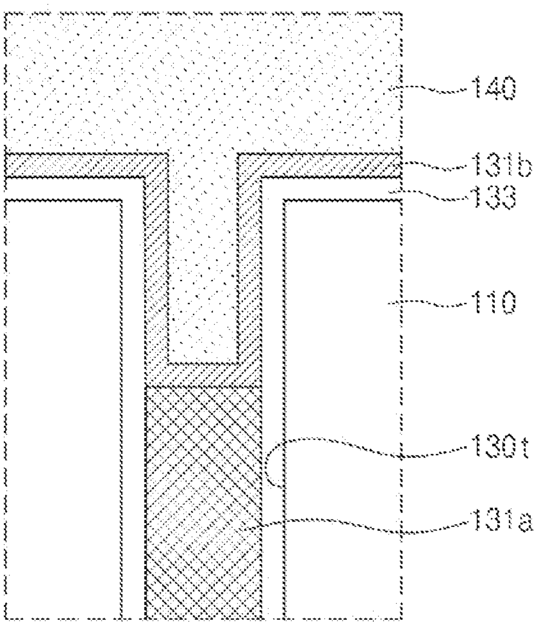
FIGS. 2B to 2D are enlarged cross-sectional views illustrating a portion P1 of FIG. 2A, according to an example embodiment.

Referring to FIGS. 2A and 2B, the pixel array of the image sensor may include a semiconductor substrate 110, a circuit wiring layer 120, a trench isolation layer 130, a color filter CF, a fence pattern 150, and a micro lens ML.

The semiconductor substrate 110 may include a first surface 110*a* and a second surface 110*b* opposite to the first surface 110*a*. The first surface 110*a* of the semiconductor substrate 110 may be a front surface, and the second surface 110*b* of the semiconductor substrate 110 may be a rear surface. A light may be incident to the second surface 110*b* of the semiconductor substrate 110. Accordingly, the second surface 110*b* may be a light incident surface.

The semiconductor substrate 110 may be a semiconductor substrate or a silicon-on-insulator (SOI) semiconductor substrate. The semiconductor substrate 110 may include, for example, a silicon semiconductor substrate, a germanium semiconductor substrate, or a silicon-germanium semiconductor substrate. The semiconductor substrate 110 may include a first conductive type impurity. Accordingly, the semiconductor substrate 110 may have a first conductive type. The first conductive type impurity may be a group III element. As an example, the first conductive type impurity may include a p-type impurity, such as aluminum (Al), boron (B), indium (In), and/or gallium (Ga).

The pixels may be provided to the semiconductor substrate 110. FIG. 2A shows two pixels, however, the present disclosure should not be limited thereto or thereby. According to an embodiment, the pixels may be arranged in a matrix in the form of rows and columns.

The semiconductor substrate 110 may include photoelectric conversion element PD respectively corresponding to the pixels. The photoelectric conversion element PD may be disposed between the first surface 110*a* and the second surface 110*b* of the semiconductor substrate 110. The photoelectric conversion element PD may be a region doped with a second conductive type impurity. The second conductive type impurity may have a conductivity opposite to that of the first conductive type impurity. According to an embodiment, the photoelectric conversion element PD may include a group V element, and the group V element may be the second conductive type impurity. The second conductive type impurity may include an n-type impurity, such as phosphorus, arsenic, bismuth, and/or antimony.

The photoelectric conversion element PD may be disposed spaced apart from the second surface 110*b* of the semiconductor substrate 110.

The trench isolation layer 130 may be provided in the semiconductor substrate 110, and the pixels may be separated and partitioned from each other by the trench isolation layer 130. As an example, the trench isolation layer 130 may be provided between the pixels of the semiconductor substrate 110.

The trench isolation layer 130 may be provided in a trench 130*t* defined through the first surface 110*a* and the second surface 110*b* of the semiconductor substrate 110 to separate the pixels from each other.

The trench isolation layer 130 may be provided in the trench 130*t*, and the trench 130*t* may be recessed from the first surface 110*a* of the semiconductor substrate 110. The trench isolation layer 130 may be a deep trench isolation layer. The trench isolation layer 130 may penetrate the first surface 110*a* and the second surface 110*b* of the semiconductor substrate 110.

The trench isolation layer 130 may include a first conductive isolation layer 131*a* extending in a direction from the first surface 110*a* toward the second surface 110*b* and having a first length L1, an insulation liner 133 disposed between the first conductive isolation layer 131*a* and the semiconductor substrate 110, and a second conductive isolation layer 131*b* extending in a direction from the second surface 110*b* toward the first surface 110*a*, having a second length L2, and being in contact with the first conductive isolation layer 131*a*.

According to an example embodiment, the first conductive isolation layer 131*a* may include a conductive material. As an example, the first conductive isolation layer 131*a* may include a material containing a doped polysilicon or metal. The doped polysilicon may include the first conductive type impurity or the second conductive type impurity as its dopant. When the first conductive isolation layer 131*a* includes the metal, tungsten, aluminum, or the like may be used, however, the present disclosure should not be limited thereto or thereby. According to an embodiment, another material having conductivity, e.g., various metals, alloys of the metals, or doped inorganic materials, may be used.

As a negative bias voltage is applied to the first conductive isolation layer 131*a*, the first conductive isolation layer 131*a* may allow holes to be stably collected in the vicinity of a boundary of the first conductive isolation layer 131*a* in an area adjacent to the trench isolation layer 130.

FIG. 2A conceptually shows that a wiring is connected to a lower portion of the first conductive isolation layer 131*a* to apply the negative bias voltage to the first conductive isolation layer 131*a*, however, the present disclosure should not be limited thereto or thereby. According to an embodiment, the wiring may be connected to an upper portion of the first conductive isolation layer 131*a*.

The first conductive isolation layer 131*a* may be filled in the trench 130*t* penetrating the first surface 110*a* and the second surface 110*b* of the semiconductor substrate 110. However, because a light transmittance of the first conductive isolation layer 131*a* is low, a portion of the first conductive isolation layer 131*a* near the light incident surface may be removed to maximize an incident amount of light. As an example, the first conductive isolation layer 131*a* may be removed from the second surface 110*b* that corresponds to the light incident surface to a point D that corresponds to a predetermined depth of the second conductive isolation layer 131*b*. The first conductive isolation layer 131*a* may be filled only from the first surface 110*a* to the point D corresponding to the predetermined depth, and the first conductive isolation layer 131*a* may not be provided inside the trench 130*t* from the point D to the second surface 110*b*. Accordingly, the first length L1 may correspond to a distance from the first surface 110*a* to the point D corresponding to the predetermined depth, and the second length L2 may correspond to a distance from the second surface 110*b* to the point D. According to an embodiment, a length of the first conductive isolation layer 131*a*, i.e., the first length L1, may be longer than a length of the second conductive isolation layer 131*b*, i.e., the second length L2. As an example, the first length L1 may be at least two or three times longer than the second length L2.

The insulation liner 133 may be provided along a sidewall of the trench 130*t*. The insulation liner 133 may be provided between the semiconductor substrate 110 and the first conductive isolation layer 131*a* to electrically insulate the first conductive isolation layer 131*a* from the semiconductor substrate 110.

The insulation liner 133 may cover the second surface 110*b* of the semiconductor substrate 110 and the sidewall of the trench 130*t* penetrating the second surface 110*b*. In addition, the insulation liner 133 may entirely cover the second surface 110*b* of the semiconductor substrate 110 as shown in FIG. 2A. However, an arrangement position of the insulation liner 133 should not be limited thereto or thereby, and a portion of the second surface 110*b* of the semiconductor substrate 110 may not be covered by the insulation liner 133 as needed.

The insulation liner 133 may include an insulating material, for example, a silicon-based insulating material such as silicon nitride ($Si_3N_4$), silicon oxide ($SiO_2$, silicate), and/or silicon carbon nitride (SiCN), and/or a high-k metal oxide such as hafnium oxide (HfOx), zirconium oxide ($ZrO_2$), titanium oxide ($TiO_2$), aluminum oxide ($Al_2O_3$), etc.

In an example embodiment, the insulation liner 133 formed as a single layer is shown, however, it should not be limited thereto or thereby. According to an embodiment, the insulation liner 133 may include a plurality of layers, and the layers may include different materials from each other.

The insulation liner 133 may include a material having a refractive index lower than that of the semiconductor substrate 110. Accordingly, a crosstalk phenomenon may be reduced or prevented from occurring between the pixels. In an example embodiment, the first conductive isolation layer 131*a* may be spaced apart from the semiconductor substrate 110 by the insulation liner 133. Accordingly, when the image sensor operates, the first conductive isolation layer 131*a* may be electrically separated from the semiconductor substrate 110.

The second conductive isolation layer 131*b* may be provided in the trench 130*t* in which the first conductive isolation layer 131*a* and the insulation liner 133 are formed. The second conductive isolation layer 131*b* may cover a side surface of the insulation liner 133 and an upper surface of the first conductive isolation layer 131*a* in a portion of the trench 130*t* from which the first conductive isolation layer 131*a* is removed. In an example embodiment, the second conductive isolation layer 131*b* may be provided between the second surface 110*b* and the point D corresponding to the predetermined depth, and as a result, a lower surface of the second conductive isolation layer 131*b* may be directly in contact with the upper surface of the first conductive isolation layer 131*a*. Because the second conductive isolation layer 131*b* is directly in contact with the first conductive isolation layer 131*a*, the negative bias voltage applied to the first conductive isolation layer 131*a* may be applied to the second conductive isolation layer 131*b*. On the contrary, when the negative bias voltage is applied to the second conductive isolation layer 131*b*, the same voltage as the negative bias voltage may be applied to the first conductive isolation layer 131*a*. Accordingly, it is allowable to apply the negative bias voltage to either of the first and second conductive isolation layers 131*a* and 131*b*, and as the wiring is connected to the upper or lower portion of the first and second conductive isolation layers 131*a* and 131*b*, the predetermined voltage may be applied to the first and second conductive isolation layers 131*a* and 131*b*.

In an example embodiment, for the convenience of explanation, a structure in which the lower surface of the second conductive isolation layer 131*b* is completely in contact with the upper surface of the first conductive isolation layer 131*a* is shown, however, the present disclosure should not be limited thereto or thereby. According to an embodiment, the lower surface of the second conductive isolation layer 131*b* may be connected to the first conductive isolation layer 131*a* by being partially in contact with the upper surface of the first conductive isolation layer 131*a* mateir. In addition, according to an embodiment, an air gap may be defined between the lower surface of the second conductive isolation layer 131*b* and the upper surface of the first conductive isolation layer 131*a*.

As at least a portion of the lower surface of the second conductive isolation layer 131*b* is in contact with the upper surface of the first conductive isolation layer 131*a*, the negative bias voltage applied to the first conductive isolation layer 131*a* may be applied to the second conductive isolation layer 131*b*. However, according to an embodiment, the lower surface of the second conductive isolation layer 131*b* may not be in contact with the upper surface of the first conductive isolation layer 131*a*, and in this case, the negative bias voltage may be applied to each of the first conductive isolation layer 131*a* and the second conductive isolation layer 131*b*.

Further, according to an example embodiment, for the convenience of explanation, the lower surface of the second conductive isolation layer 131*b* is shown as flat, however, the present disclosure should not be limited thereto or thereby, and the lower surface of the second conductive isolation layer 131*b* may not be flat. For example, the lower surface of the second conductive isolation layer 131*b* may have a concavo-convex shape or a round shape.

According to an embodiment, the shape of the trench 130*t* in which the first and second conductive isolation layers 131*a* and 131*b* are formed may be changed in various ways depending on processes. As an example, the portion of the trench 130*t* where the second conductive isolation layer 131*b* is formed may have a width different from a width of the portion of the trench 130*t* where the first conductive isolation layer 131*a* is formed.

Figure 2C:
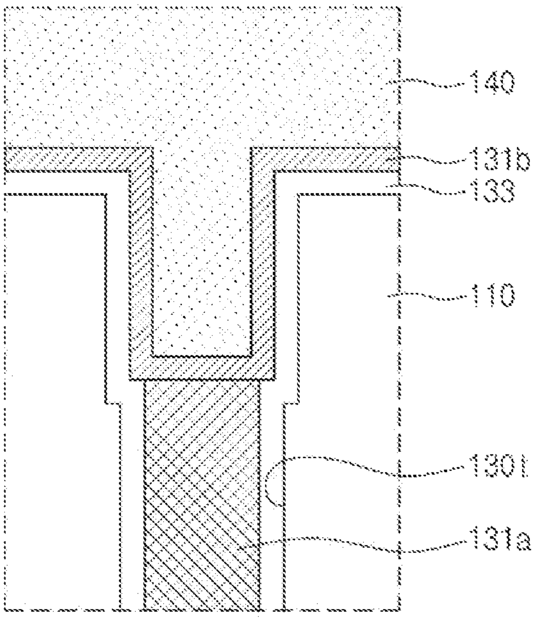
Figure 2D:
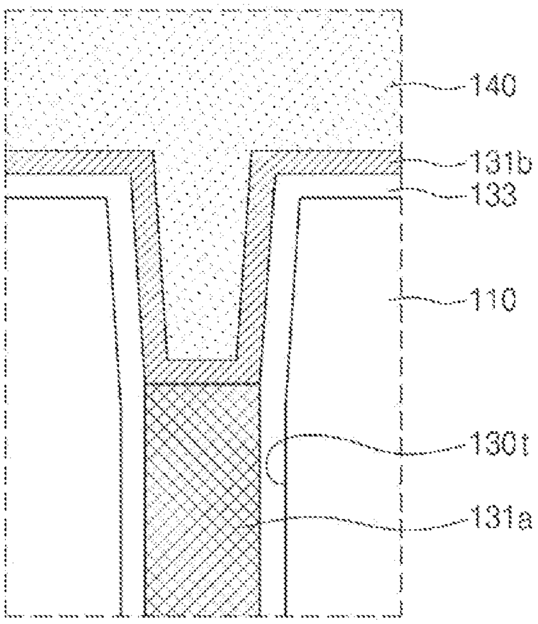

FIGS. 2C and 2D are embodiments illustrating structures in which a portion of a trench 130*t* where a second conductive isolation layer 131*b* is formed has a different shape from that of a portion of the trench 130*t* where a first conductive isolation layer 131*a* is formed. Referring to FIGS. 2C and 2D, a width of the portion of the trench 130*t* where the second conductive isolation layer 131*b* is formed may be greater than a width of the portion of the trench 130*t* where the first conductive isolation layer 131*a* is formed or may gradually increase toward a second surface 110*b*. This is to effectively remove the first conductive isolation layer 131*a* when the second conductive isolation layer 131*b* is formed and to easily form the second conductive isolation layer 131*b*.

According to an embodiment, the second conductive isolation layer 131*b* may be disposed in the trench 130*t* to have a second length L2 and may extend onto the second surface 110*b* of a semiconductor substrate 110 to be disposed on an insulation liner 133. Accordingly, the second conductive isolation layer 131*b* and the insulation liner 133 may entirely cover the second surface 110*b*, which is a light incident surface of the semiconductor substrate 110.

The second conductive isolation layer 131*b* may include a transparent conductive material. In detail, the second conductive isolation layer 131*b* may include a material having a transmittance of about 70% or more, for example, a transmittance of about 80% or more, and may have a high electrical conductivity and a low resistance. As an example, the electrical conductivity may be equal to or greater than about $10^3$ S/cm, and the resistance may be equal to or smaller than about $10^{-3}$ Ωcm. In this case, the material may have a band gap larger than a band gap of a visible light so that the visible light passes through the material without being absorbed. As an example, the material may have the band gap equal to or greater than about 3.5 eV (400 nm).

The material for the second conductive isolation layer 131*b* should not be particularly limited as long as the conditions described above are satisfied, and for example, the second conductive isolation layer 131*b* may include the transparent conductive material.

The transparent conductive material may include a transparent conductive oxide, a metal grid, a random metal network, a carbon nanotube, a graphene, a nanowire mesh, an ultra-thin metal film, a conductive polymer, and the like.

The transparent conductive oxide may include indium tin oxide (ITO), indium zinc oxide (IZO), aluminum-doped zinc oxide (AZO), indium gallium zinc oxide (IGZO), fluorine-doped tin oxide, niobium-doped anatase, etc.

Color filters CF may be disposed at every pixel on the second surface 110*b* of the semiconductor substrate 110. As an example, the color filters CF may be respectively provided at positions corresponding to the photoelectric conversion element PD. Each of the color filters CF may include one of a red filter, a blue filter, and a green filter, however, the present disclosure should not be limited thereto or thereby, and a filter having another color may be provided. The color filters CF may form color filter arrays.

The fence pattern 150 may be disposed on the trench isolation layer 130. As an example, the fence pattern 150 may overlap the trench isolation layer 130 when viewed in a vertical direction. The fence pattern 150 may have a shape corresponding to that of the trench isolation layer 130 when viewed in the plane. As an example, the fence pattern 150 may have a grid shape when viewed in the plane. The fence pattern 150 may surround the color filters CF when viewed in the plane. The fence pattern 150 may be disposed between two color filters CF adjacent to each other. The color filters CF may be physically and optically separated from each other by the fence pattern 150. The fence pattern 150 may include a low-refractive-index material. The low-refractive-index material may include a polymer and silica nanoparticles distributed in the polymer. The low-refractive-index material may have an insulating property. According to an embodiment, the fence pattern 150 may include a metal material and/or a metal nitride material. As an example, the fence pattern 150 may include titanium and/or titanium nitride.

An upper insulating layer 140 may be disposed between the semiconductor substrate 110 and the color filters CF and between the trench isolation layer 130 and the fence pattern 150. The upper insulating layer 140 may cover the second surface 110*b* of the semiconductor substrate 110 and an upper surface of the trench isolation layer 130. The upper insulating layer 140 may include a plurality of layers, and as an example, the upper insulating layer 140 may include an anti-reflective layer.

The micro lens ML may be disposed on the second surface 110*b* of the semiconductor substrate 110. As an example, the micro lens ML may be disposed on the color filters CF and the fence pattern 150. The micro lens ML may include a lens pattern and a flat portion. The flat portion of the micro lens ML may be provided on the color filters CF. The lens pattern may be provided on the flat portion. The lens pattern may be formed integrally with the flat portion, and the lens pattern may be connected to the flat portion without an interface therebetween. The lens pattern may include the same material as that of the flat portion. According to an embodiment, the flat portion may be omitted, and the lens pattern may be disposed directly on the color filters CF. The lens pattern may have a hemispherical shape. The lens pattern may condense the light incident thereto. The lens pattern may be disposed at positions corresponding to the photoelectric conversion element PD of the semiconductor substrate 110. As an example, the lens pattern may be provided on the photoelectric conversion element PD of a pixel area of the semiconductor substrate 110.

The micro lens ML may be transparent and may transmit the light. The micro lens ML may include an organic material such as a polymer. As an example, the micro lens ML may include a photoresist material or a thermoset resin.

According to embodiments of the present disclosure, the trench isolation layer may be modified in various ways within the concept of the present disclosure. The following embodiments are some of the various modifications within the concept of the present disclosure, and the embodiments may be combined with each other within the scope compatible with the present disclosure.

FIGS. 3A to 3D are cross-sectional views illustrating trench isolation layers in the portion P1 of FIG. 2A.

Figure 3A:
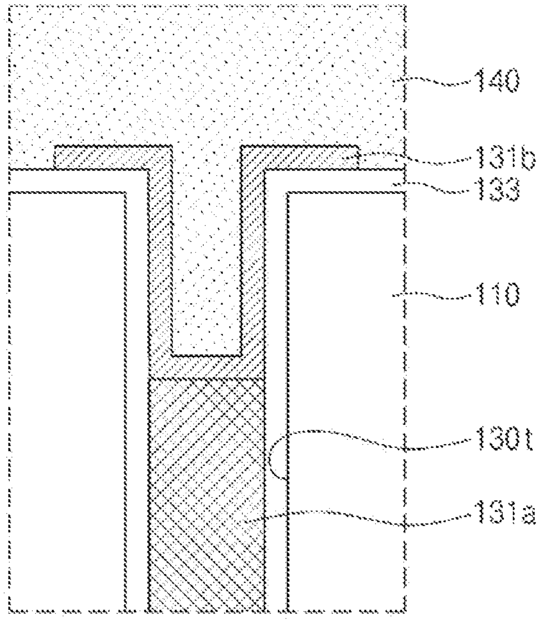
FIGS. 3A to 3D are cross-sectional views illustrating trench isolation layers in the portion P1 of FIG. 2A, according to an example embodiment.
Figure 3B:
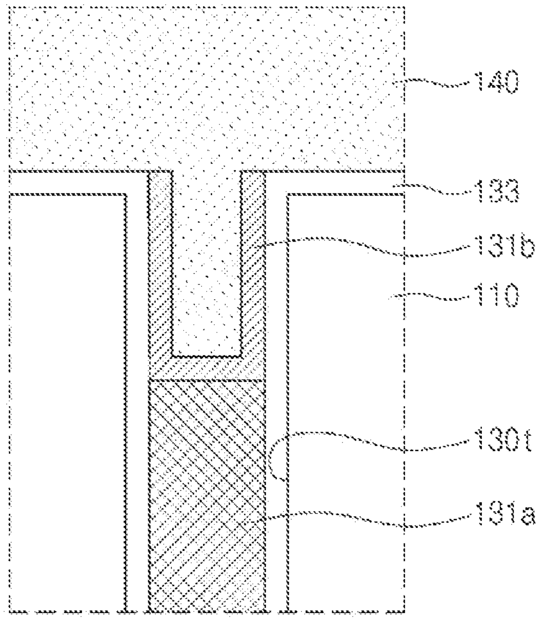

Referring to FIG. 3A, a second conductive isolation layer 131*b* may be disposed in a trench 130*t*, and the second conductive isolation layer 131*b* may extend to be disposed only on a portion of a second surface 110*b* of a semiconductor substrate 110. Referring to FIG. 3B, a second conductive isolation layer 131*b* may be disposed only in a trench 130*t* and may not extend to a second surface 110*b*.

When the second conductive isolation layer 131*b* extends onto the second surface 110*b* of the semiconductor substrate 110, the second conductive isolation layer 131*b* may cover at least a portion of the second surface 110*b* of the semiconductor substrate 110. In this case, the second conductive isolation layer 131*b* may be an area corresponding to a circumference of each pixel when viewed in the plane. That is, the second conductive isolation layer 131*b* may not be provided at a center portion where the light is mainly incident in each pixel. A light transmittance may further increase in the portion where the second conductive isolation layer 131*b* is not provided, and an amount of the light provided to a photoelectric conversion region may increase. Thus, a sensitivity of the image sensor may increase.

Figure 3C:
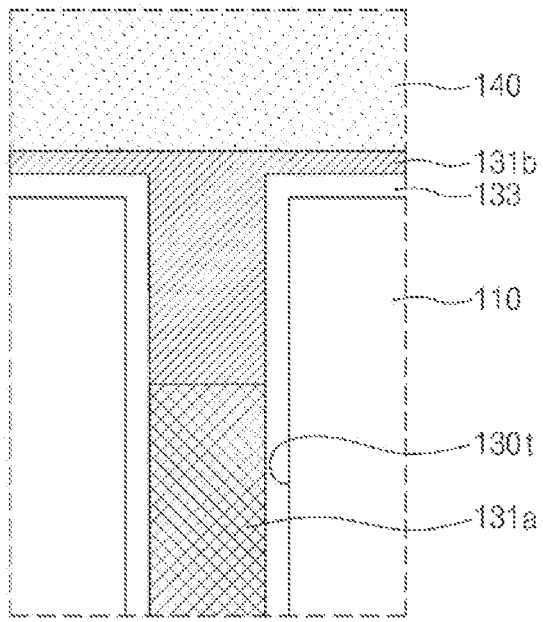

In the above-mentioned embodiments, the second conductive isolation layer 131*b* may be conformally formed in the portion where a first conductive isolation layer 131*a* is not formed and may cover a sidewall of an insulation liner 133 and an upper surface of the first conductive isolation layer 131*a*, and in this case, an upper insulating layer 140 may be formed to fill a remaining portion of the trench 130*t* as described above. However, according to an example embodiment, the second conductive isolation layer 131*b* may be provided to fill all the remaining portion inside the trench 130*t* in which the first conductive isolation layer 131*a* is not provided. Referring to FIG. 3C, a second conductive isolation layer 131*b* may be filled in a trench 130*t* between a second surface 110*b* of a semiconductor substrate 110 and a point that is spaced apart from the second surface 110*b* by a predetermined depth. Accordingly, an effect of a negative bias voltage applied to the second conductive isolation layer 131*b* may be maximized.

According to an embodiment, an insulation pattern 135 having a high dielectric constant, which is capable of fixing charges and suppressing a movement of the charges may be further provided on the second conductive isolation layer 131*b*.

Figure 3D:
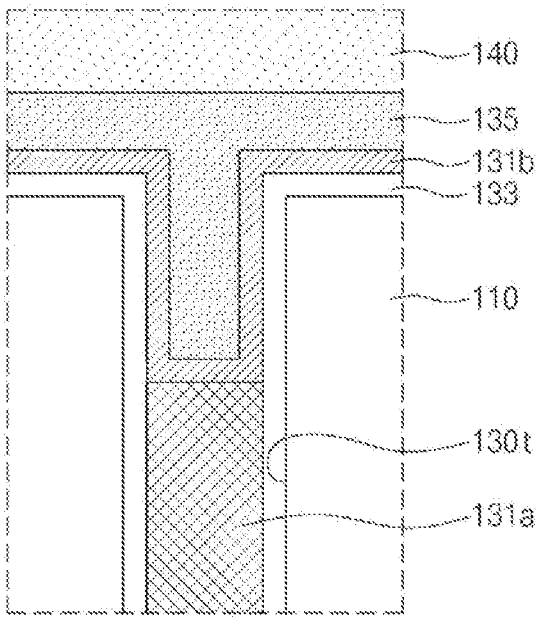

FIG. 3D shows a structure in which an insulation pattern 135 having a high dielectric permittivity is provided on a second conductive isolation layer 131*b*. The insulation pattern 135 may be provided between the second conductive isolation layer 131*b* and an upper insulating layer 140 to cover the second conductive isolation layer 131*b*. The insulation pattern 135 may include a material having a dielectric permittivity substantially equal to or higher than that of an insulation liner 133.

The insulation pattern 135 may include, for example, silicon nitride, silicon oxide, silicon carbon nitride, and/or a high-k metal oxide. The high-k metal oxide may include, for example, hafnium oxide, zirconium oxide, aluminum oxide, titanium oxide, tantalum oxide, lanthanum oxide, praseodymium oxide, cerium oxide, neodymium oxide, promethium oxide, samarium oxide, europium oxide, gadolinium oxide, terbium oxide, dysprosium oxide, erbium oxide, holmium oxide, thulium oxide, ytterbium oxide, ruthenium oxide, yttrium oxide, aluminum nitride, hafnium oxynitride, aluminum oxynitride, and the like. As the high-dielectric material is used, it is possible to effectively suppress the generation of abnormal charges.

The image sensor having the above-described structure may reduce the loss of the incident light while minimizing a defect of a dark current.

According to a related art image sensor, a conductive isolation layer is formed in a trench using polysilicon, however, as the conductive isolation layer is formed penetrating a first surface and a second surface, the conductive isolation layer containing polysilicon absorbs an incident light. In order to solve this optical loss, a portion of the conductive isolation layer formed of polysilicon is removed to a predetermined depth, and a transparent insulating layer is formed in the removed portion. However, in this case, a dark current occurs in the transparent insulating layer.

According to the present disclosure, different from the related art image sensor, because the first conductive isolation layer from which the portion between the second surface and the predetermined depth is removed in the trench is used, the absorption of the light by the first conductive isolation layer may be reduced. In addition, as the negative bias voltage is applied to the first conductive isolation layer, the holes may be collected around the trench isolation layer, and thus, the generation of the dark current may be reduced.

In addition, because the second conductive isolation layer is provided in the portion where the first conductive isolation layer is not provided between the second surface and the predetermined depth to be directly in contact with the first conductive isolation layer, the negative bias voltage may be applied to the second conductive isolation layer. Similar to the first conductive isolation layer, the second conductive isolation layer may stably collect the holes around the boundary of the second conductive isolation layer in the area adjacent to the trench isolation layer. As a result, particularly, because the second conductive isolation layer is provided in the portion where the first conductive isolation layer is not provided between the second surface and the predetermined depth in the trench and collects the holes around the boundary of the second conductive isolation layer in the area adjacent to the trench between the second surface and the predetermined depth, the generation of the dark current may be reduced. Further, because the second conductive isolation layer is formed of the transparent conductive material, the second conductive isolation layer may have high light transmittance, and thus, the second conductive isolation layer may not absorb the light incident to the photoelectric conversion region. Accordingly, the loss of the light incident to the photoelectric conversion region may be reduced, a photoelectric conversion efficiency may be improved, and as a result, the sensitivity of the image sensor may be improved.

In the image sensor according to the embodiments of the present disclosure, the trench isolation layer may be manufactured in various shapes, and FIGS. 4A to 4G are cross-sectional views sequentially illustrating a method of manufacturing the trench isolation layer. The trench isolation layer shown in FIGS. 2A and 2B will be described with the pixels with reference to FIGS. 4A to 4G, and, for the convenience of explanation, components other than the trench isolation layer are omitted.

Figure 4A:
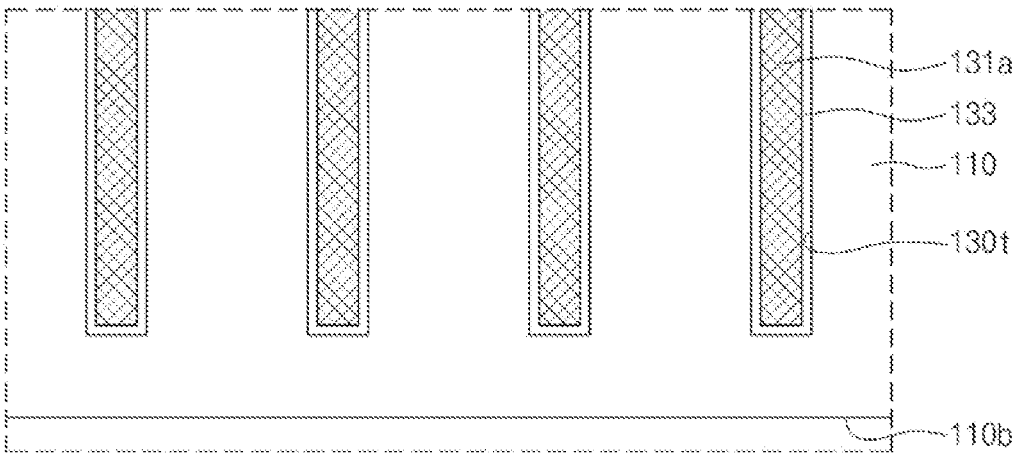
FIGS. 4A to 4G are cross-sectional views sequentially illustrating a method of manufacturing a trench isolation layer according to an example embodiment.

Referring to FIG. 4A, the trench 130*t* may be formed in a direction from the first surface 110*a* to the second surface 110*b*, the insulation liner 133 may be conformally formed in the trench 130*t*, and the trench 130*t* may be filled with the first conductive isolation layer 131*a*. A first circuit wiring layer may be formed on the first surface 110*a*.

Figure 4B:
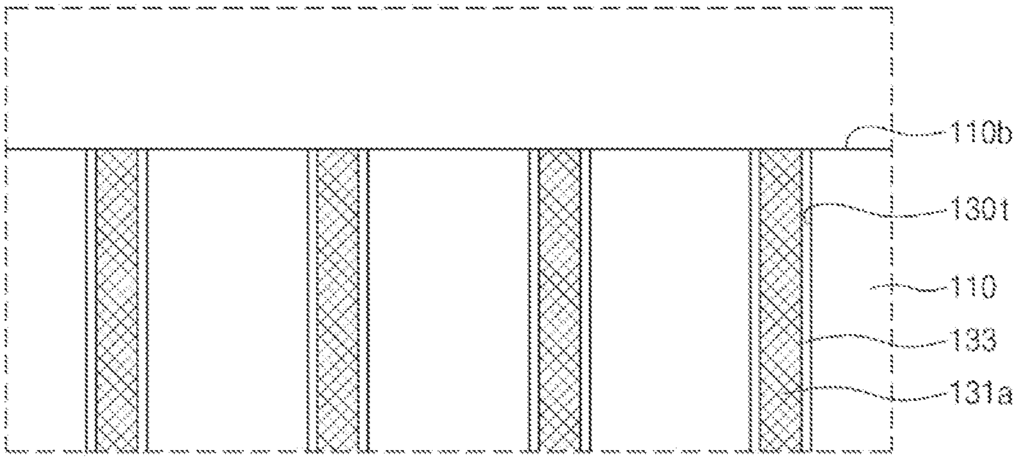

Referring to FIG. 4B, after the semiconductor substrate 110 is turned upside down, a portion of the semiconductor substrate 110, which is adjacent to the second surface 110*b*, may be removed. The portion of the semiconductor substrate 110 may be removed by a chemical mechanical polishing (CMP) process. The CMP process may be performed until the trench isolation layer penetrates both surfaces of the semiconductor substrate 110, i.e., until the first conductive isolation layer 131*a* and the insulation liner 133 are exposed to the outside. The polished semiconductor substrate 110 may be subjected to a hydrogen/deuterium annealing process to heal defects in the semiconductor substrate 110, for example, dangling bonds.

Figure 4C:
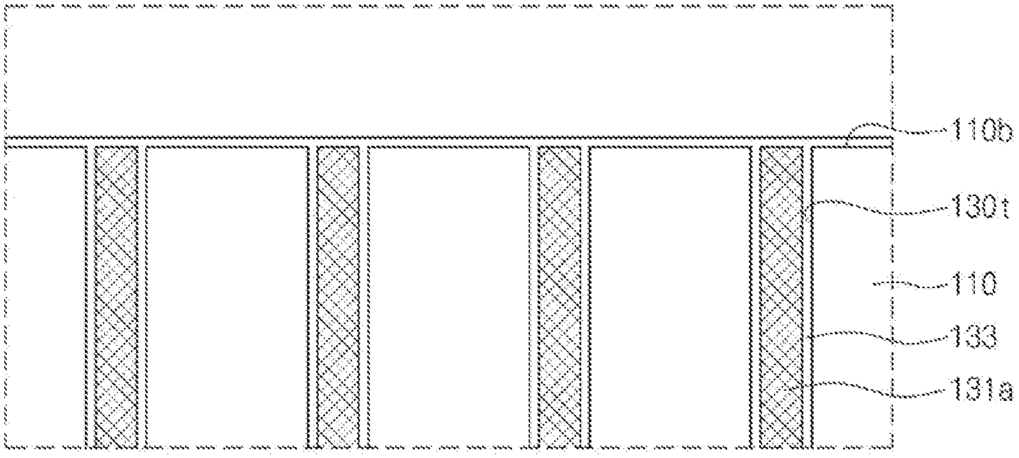

Referring to FIG. 4C, an insulating layer may be formed on the semiconductor substrate 110. The insulating layer may be formed to cover the second surface 110*b* of the semiconductor substrate 110 so that the second conductive isolation layer 131*b* formed layer is insulated from the semiconductor substrate 110. The insulating layer may include the same material as the insulation liner 133. In FIG. 4C, for the convenience of explanation, the insulating layer is assigned with the same reference numeral as the insulation liner 133.

Figure 4D:
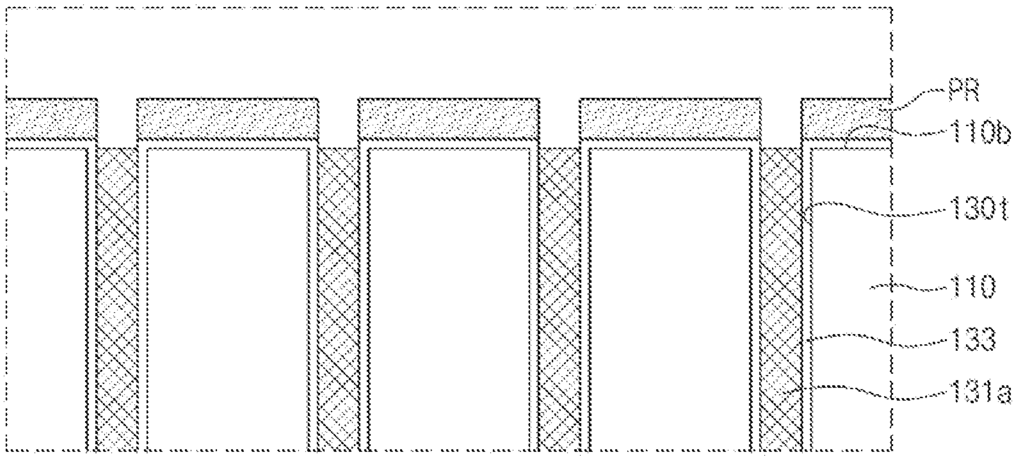

Referring to FIG. 4D, a photoresist pattern PR may be formed on the semiconductor substrate 110 in which the insulation liner 133 is formed, and then, the portion of the insulation liner 133, which is particularly disposed on the first conductive isolation layer 131*a*, may be removed using the photoresist pattern PR as a mask.

Figure 4E:
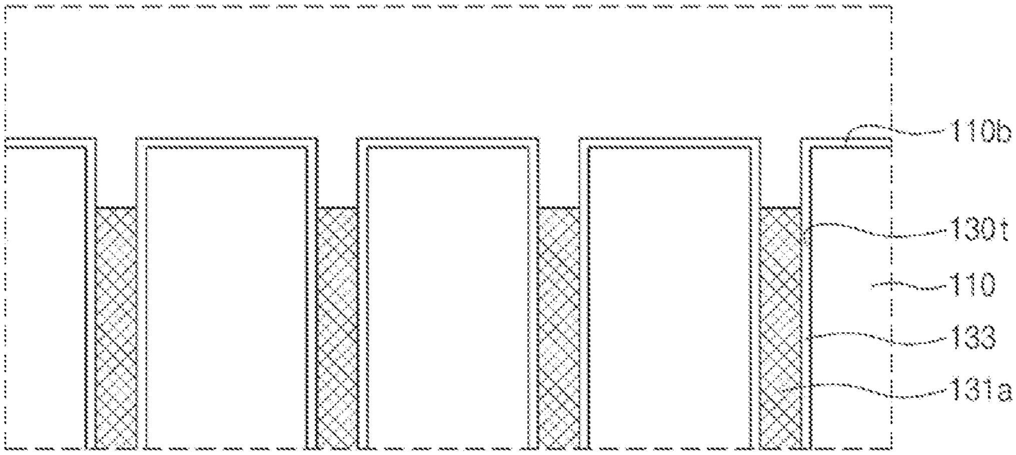

Referring to FIG. 4E, the first conductive isolation layer 131*a* disposed between the second surface 110*b* and the predetermined depth, may be consecutively removed. The first conductive isolation layer 131*a* may be removed by an ashing process.

Figure 4F:
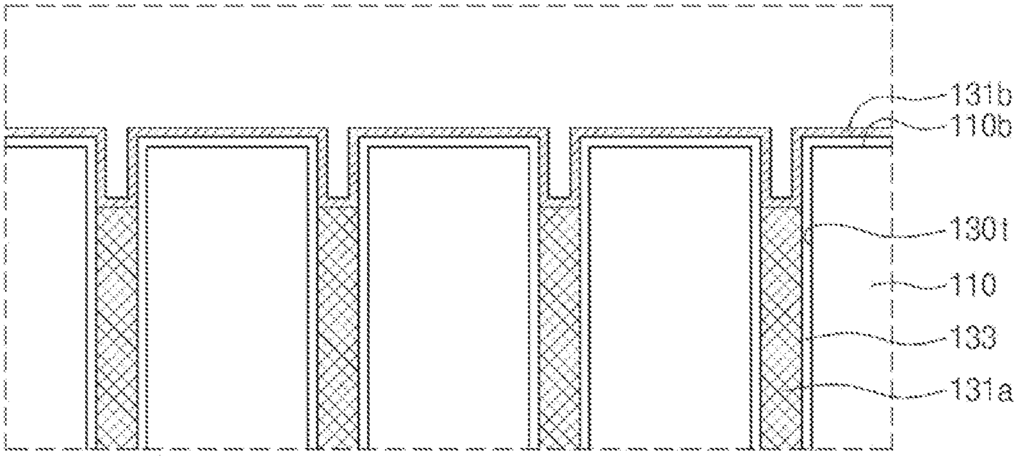

Referring to FIG. 4F, the second conductive isolation layer 131*b* may be formed on the first conductive isolation layer 131*a* removed to the predetermined depth. The second conductive isolation layer 131*b* may be formed in the trench 130*t* from which the first conductive isolation layer 131*a* is removed and on the second surface 110*b* of the semiconductor substrate 110.

Figure 4G:
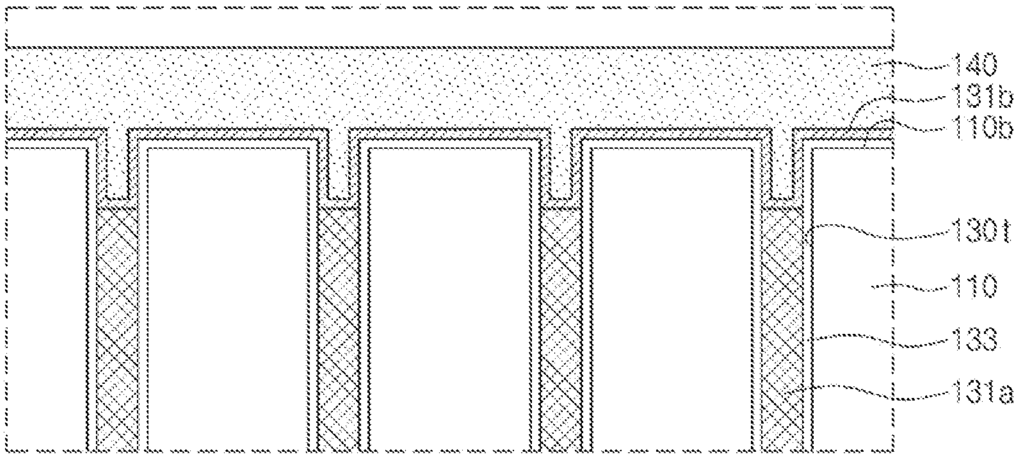

Referring to FIG. 4G, the upper insulating layer 140 may be formed on the semiconductor substrate 110 on which the second conductive isolation layer 131*b* is formed, and a portion of the upper insulating layer 140 may be filled in the trench 130*t*.

As described above, the trench isolation layer of the image sensor may be easily formed through simplified processes performed on the second surface of the semiconductor substrate. In addition, the image sensors according to the above embodiments may be easily manufactured by using some of the processes of FIGS. 4A to 4G but performing an additional or alternative process.

FIGS. 5A to 5D are cross-sectional views sequentially illustrating processes of forming the trench isolation layer of FIG. 3A.

The processes shown in FIGS. 4A to 4F may be performed before the trench isolation layer shown in FIG. 3A is formed, and a process of patterning the second conductive isolation layer 131*b* formed on the semiconductor substrate 110 may be additionally carried out.

Figure 5A:
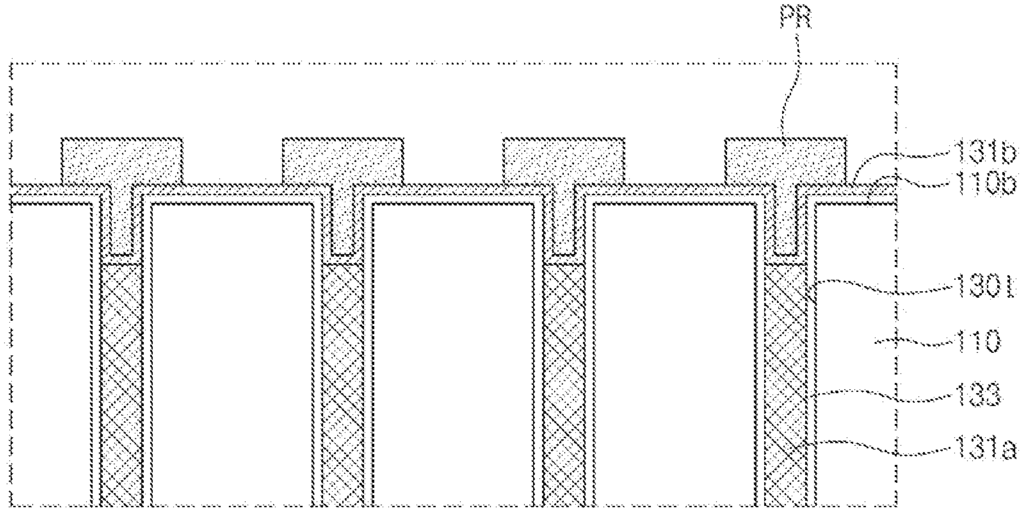
FIGS. 5A to 5D are cross-sectional views sequentially illustrating processes of forming a trench isolation layer according to an example embodiment.
Figure 5B:
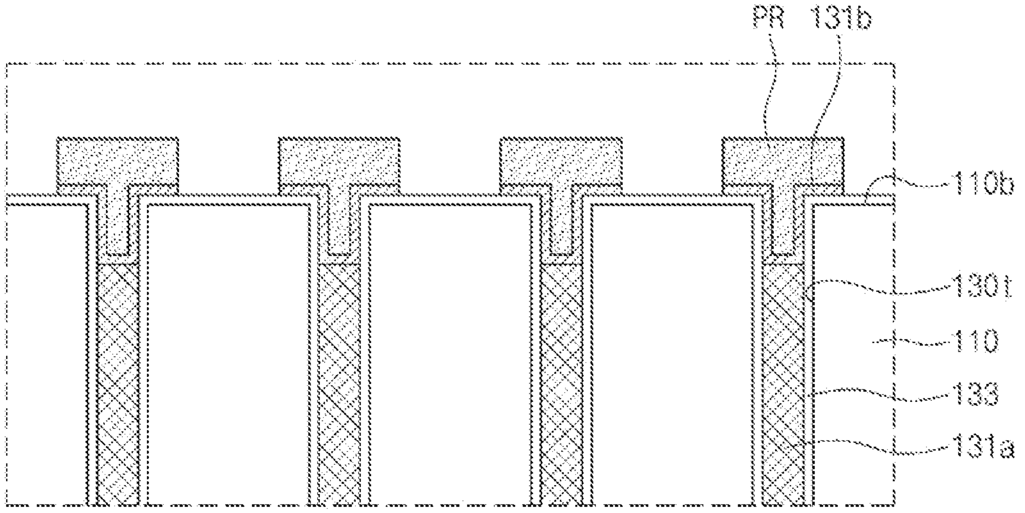
Figure 5C:
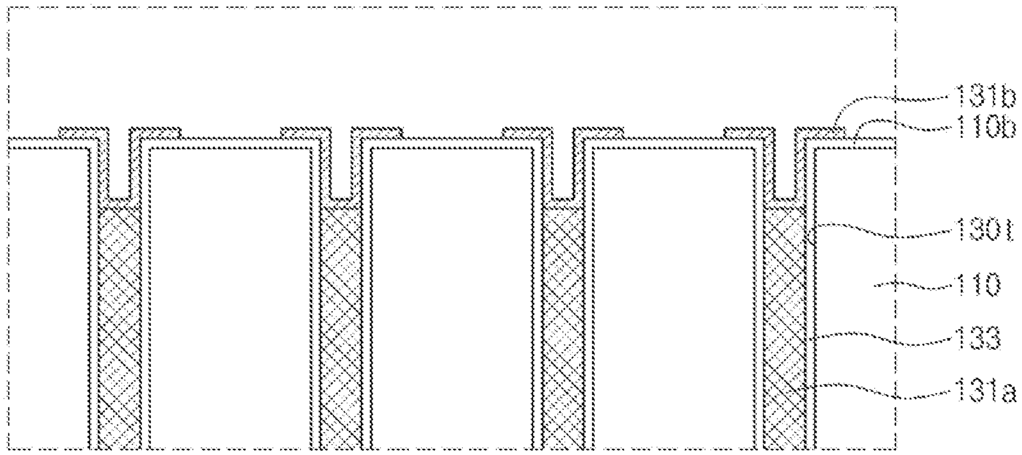
Figure 5D:
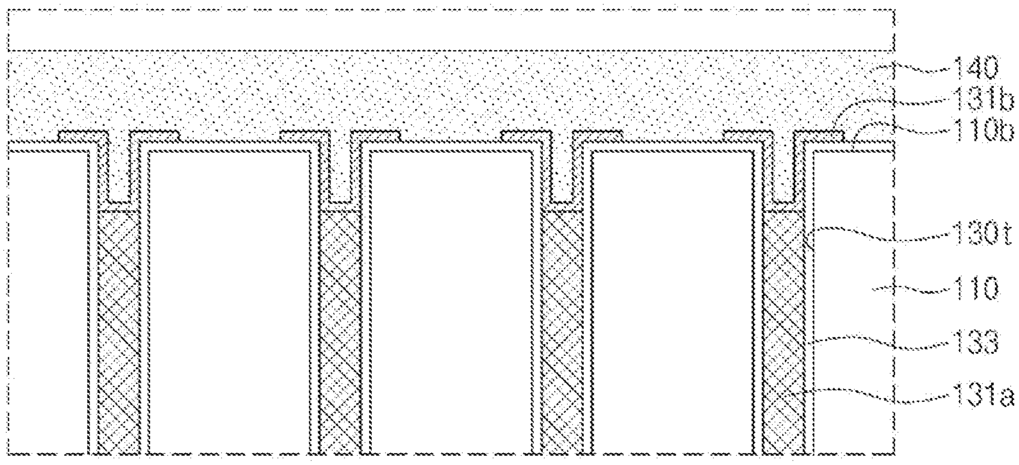

Referring to FIG. 5A, a photoresist pattern PR may be provided on the second surface 110*b* of the semiconductor substrate 110 on which the second conductive isolation layer 131*b* is formed. The photoresist pattern PR may be disposed in areas except the portion of the second conductive isolation layer 131*b* to be removed. Referring to FIG. 5B, the second conductive isolation layer 131*b* may be removed using the photoresist pattern PR as a mask. Referring to FIGS. 5C and 5D, the upper insulating layer 140 may be formed on the second surface 110*b* of the semiconductor substrate 110 after the photoresist pattern PR is removed.

The trench isolation layer shown in FIG. 3B may be manufactured in the same manner using the processes of FIGS. 4A to 4F and 5A to 5D.

Figure 6A:
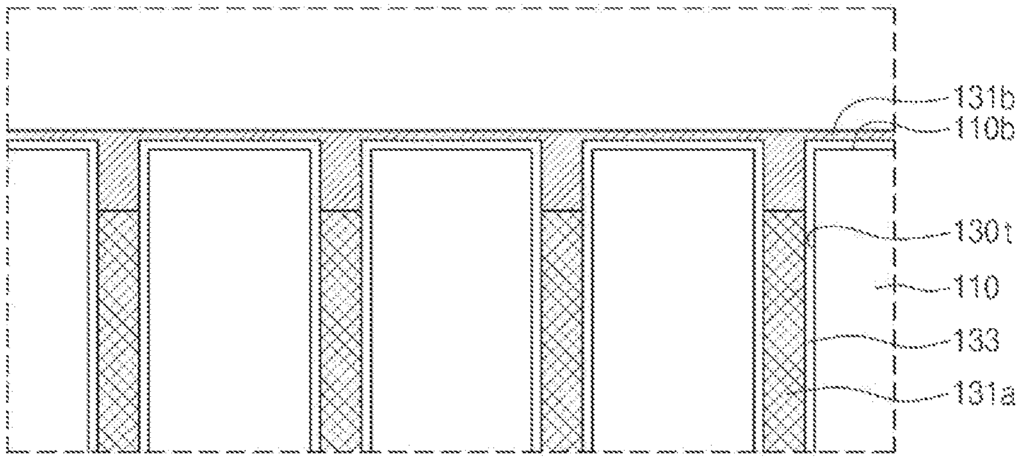
FIGS. 6A and 6B are cross-sectional views sequentially illustrating processes of forming a trench isolation layer according to an example embodiment.
Figure 6B:
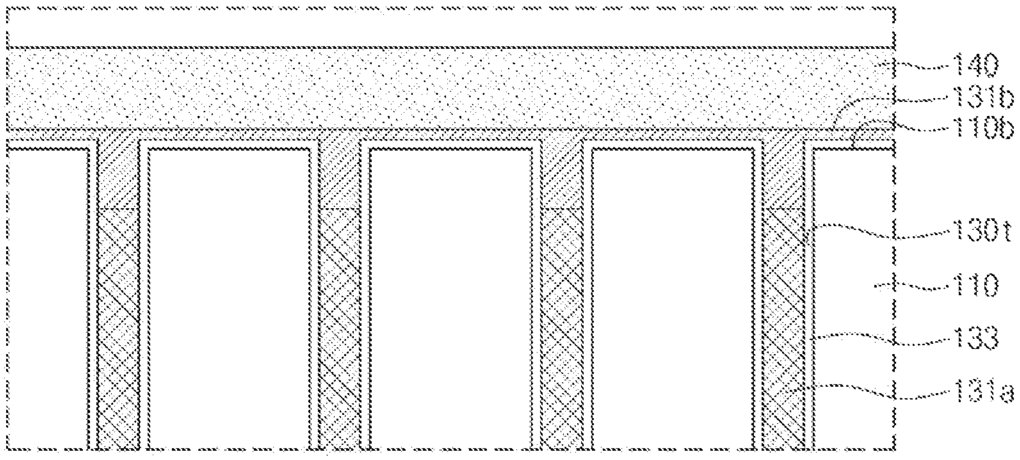

FIGS. 6A and 6B are cross-sectional views sequentially illustrating processes of forming the trench isolation layer of FIG. 3C.

The trench isolation layer shown in FIG. 3C may be formed by filling the trench 130*t* with the material for the second conductive isolation layer 131*b* as shown in FIG. 6A and forming the upper insulating layer 140 on the semiconductor substrate 110 as shown in FIG. 6B after the processes shown in FIGS. 4A to 4E are performed.

Figure 7A:
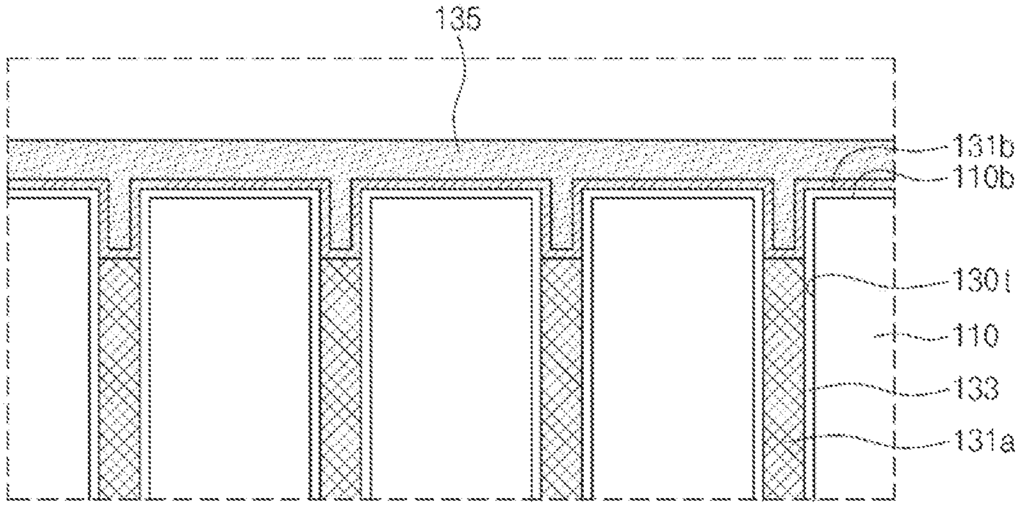
FIGS. 7A and 7B are cross-sectional views sequentially illustrating processes of forming a trench isolation layer according to an example embodiment.
Figure 7B:
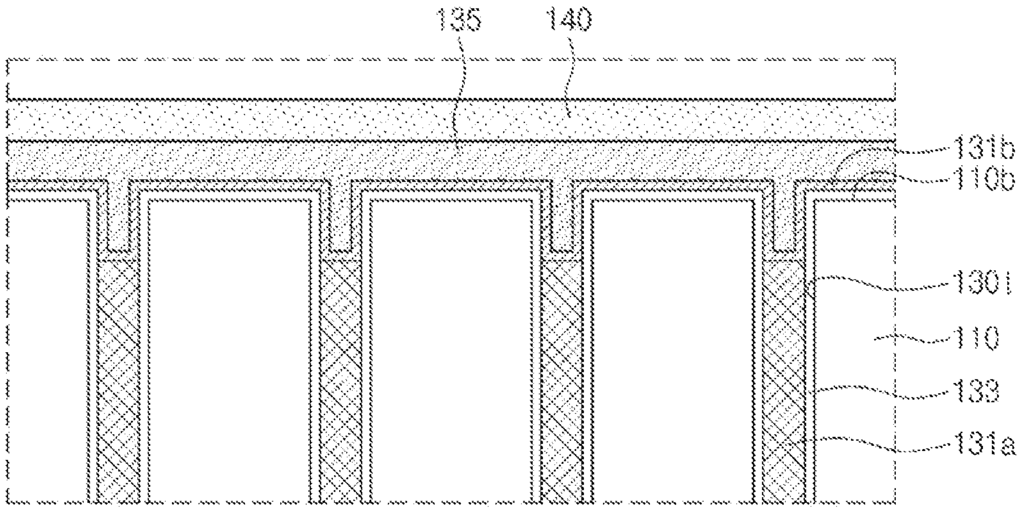

FIGS. 7A and 7B are cross-sectional views sequentially illustrating processes of forming the trench isolation layer of FIG. 3D.

The trench isolation layer shown in FIG. 3D may be formed by forming the insulation pattern 135 on the second conductive isolation layer 131*b* and in the trench 130*t* with the material for the insulation pattern as shown in FIG. 7A and forming the upper insulating layer 140 on the insulation pattern 135 as shown in FIG. 7B after the processes shown in FIGS. 4A to 4F are performed.

The above-mentioned image sensor may be implemented in various ways. Hereinafter, an embodiment of the pixel in the image sensor according to an example embodiment will be described in detail.

Figure 8:
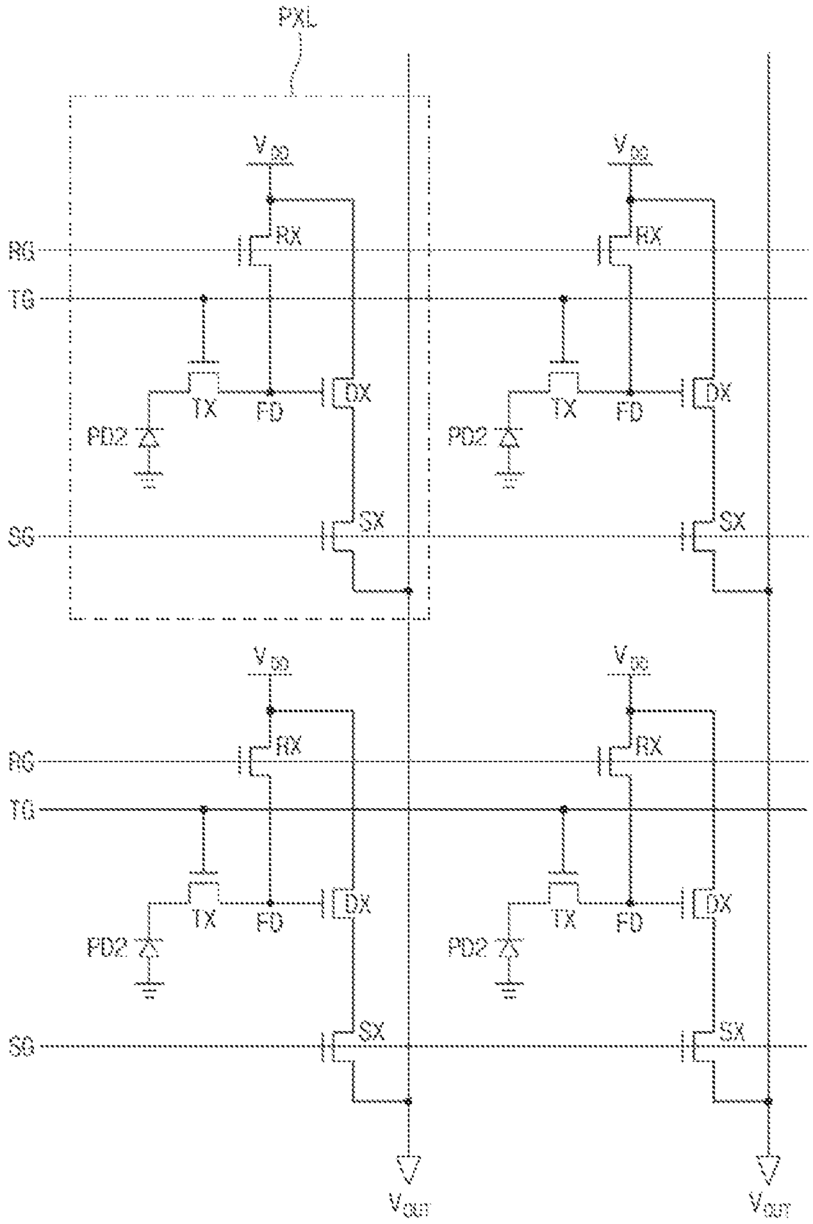
FIG. 8 is a circuit diagram illustrating a pixel of an image sensor according to an example embodiment.

FIG. 8 is a circuit diagram illustrating a pixel of an image sensor according to an example embodiment.

Referring to FIG. 8, the pixel array may include a plurality of pixels, and the pixels may be arranged in a matrix form. Each pixel may include a transfer transistor TX and logic transistors RX, SX, and DX. The logic transistors may include a reset transistor RX, a selection transistor SX, and a source-follower transistor DX. The transfer transistor TX may include a transfer gate TG. Each pixel may further include a photoelectric conversion element PD and a floating diffusion region FD.

The photoelectric conversion element PD may generate and accumulate photocharges in proportion to an amount of light incident from the outside. The photoelectric conversion element PD may include a photodiode, a phototransistor, a photogate, a pinned photodiode, and a combination thereof. The transfer transistor TX may transfer the charges generated by the photoelectric conversion element PD to the floating diffusion region FD. The floating diffusion region FD may receive and accumulate the charges generated by the photoelectric conversion element PD.

The source-follower transistor DX may be controlled according to an amount of the charges accumulated in the floating diffusion region FD.

The reset transistor RX may periodically reset the charges accumulated in the floating diffusion region FD. A drain electrode of the reset transistor RX may be connected to the floating diffusion region FD, and a source electrode of the reset transistor RX may be connected to a power supply voltage VDD. When the reset transistor RX is turned on, the power supply voltage VDD connected to the source electrode of the reset transistor RX may be applied to the floating diffusion region FD. Accordingly, when the reset transistor RX is turned on, the charges accumulated in the floating diffusion region FD may be discharged, and thus, the floating diffusion region FD may be reset.

The source-follower transistor DX may act as a source-follower buffer amplifier. The source-follower transistor DX may amplify a variation in potential in the floating diffusion region FD and may output the amplified potential variation to an output line Vout.

The selection transistor SX may select pixels to read out on a row-by-row basis. When the selection transistor SX is turned on, the power supply voltage VDD may be applied to a drain electrode of the source-follower transistor DX.

Figure 9A:
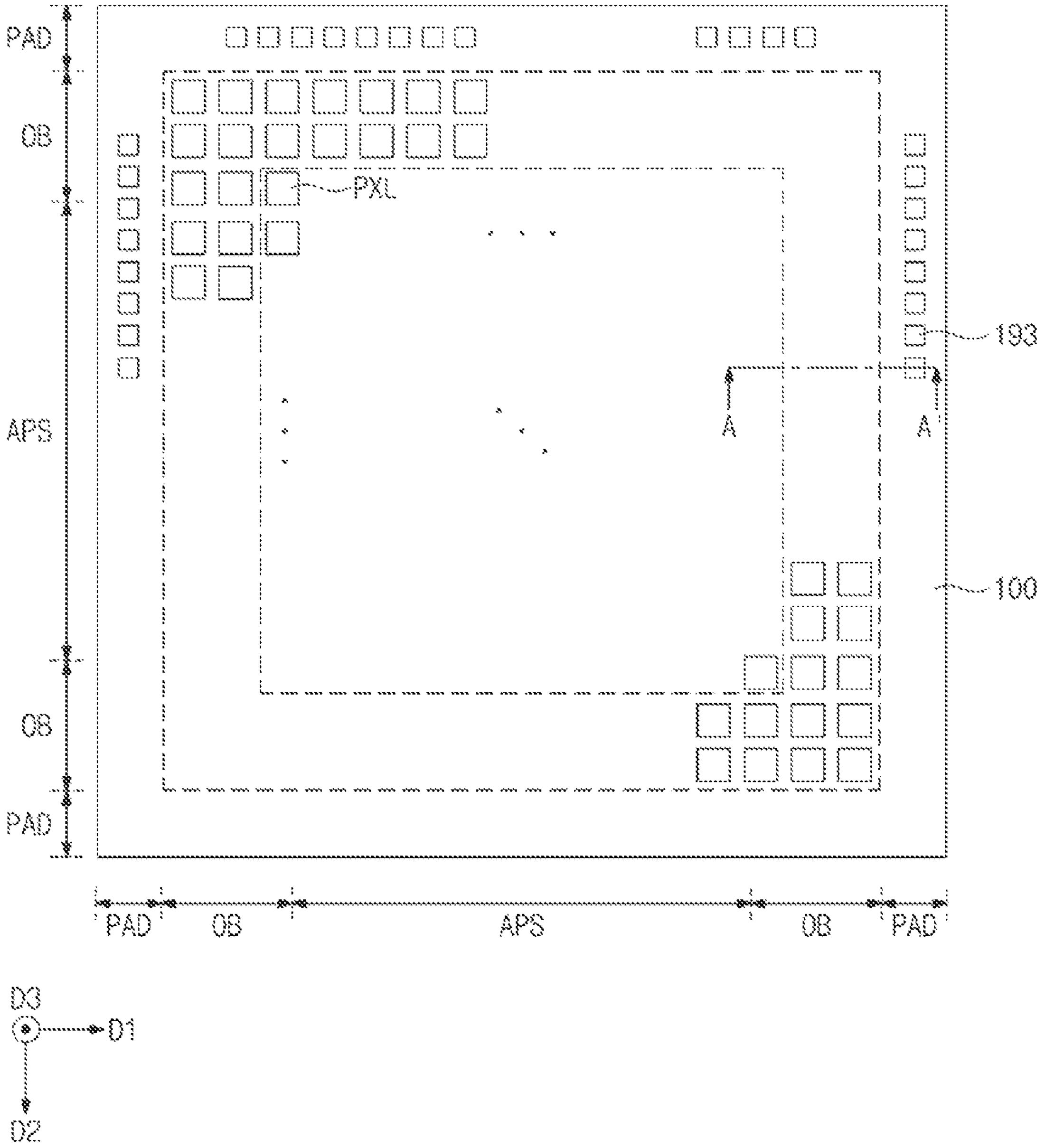
FIG. 9A is a plan view illustrating an image sensor according to an example embodiment.
Figure 9B:
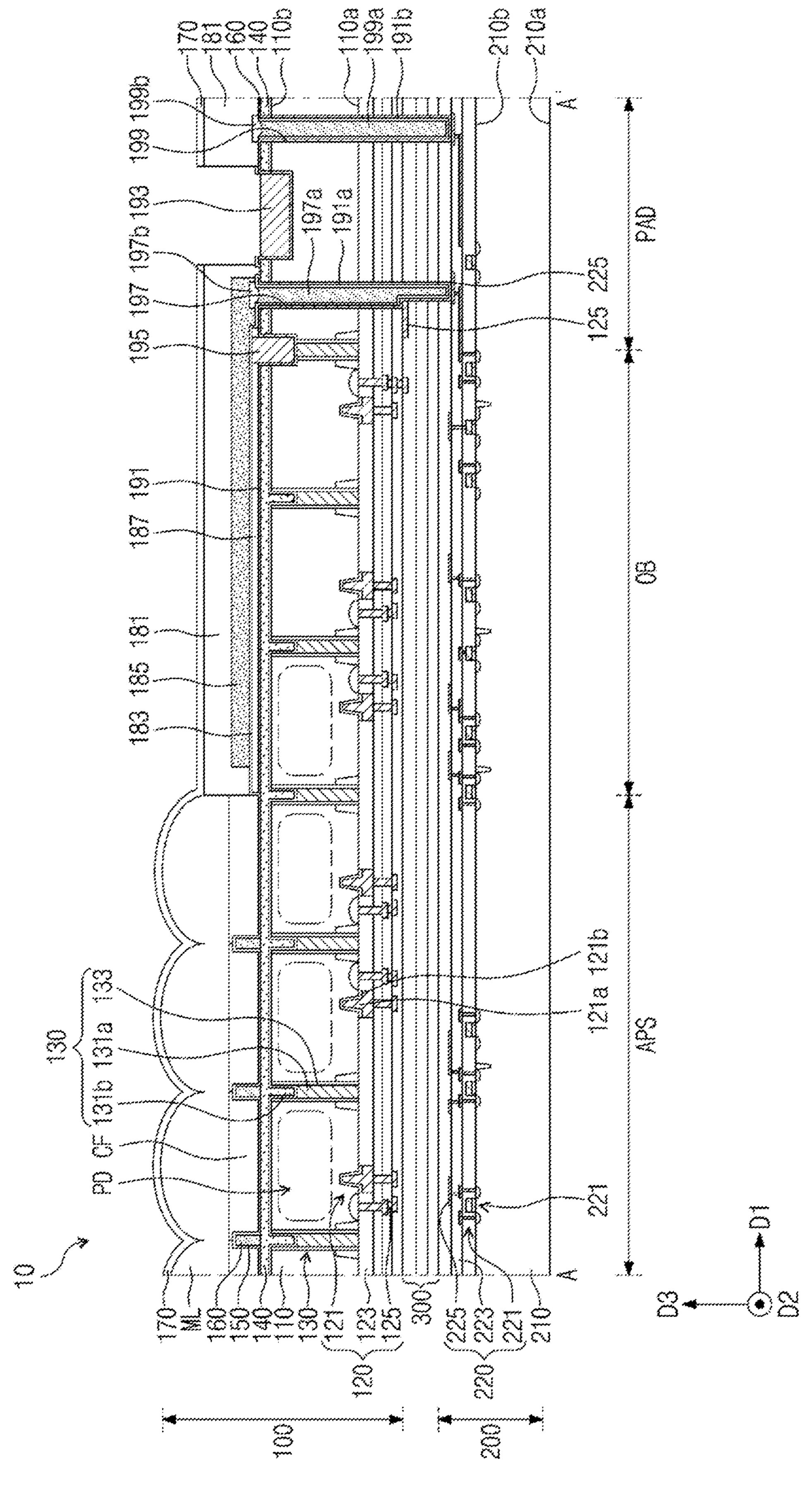
FIG. 9B is a cross-sectional view taken along a line A-A' of FIG. 9A, according to an example embodiment.

FIG. 9A is a plan view illustrating the image sensor according to an example embodiment. FIG. 9B is a cross-sectional view taken along a line A-A' of FIG. 9A.

Referring to FIGS. 9A and 9B, the image sensor 10 may have a stacked structure manufactured by bonding a plurality of structures. In this case, the image sensor 10 may include a first chip 100 as a sensor chip, a second chip 200 as a logic chip, and an adhesive portion 300 disposed between the first chip 100 and the second chip 200 to connect the first chip 100 and the second chip 200.

In the following embodiment, each chip may include a semiconductor substrate and a circuit wiring layer. Accordingly, the semiconductor substrate and the circuit wiring layer described in the above embodiments are referred to as the first semiconductor substrate and the first circuit wiring layer, respectively, to avoid confusion with a semiconductor substrate and a circuit wiring layer of the other chip, and the semiconductor substrate and the circuit wiring layer in the other chip are referred to as a second semiconductor substrate and a second circuit wiring layer, respectively.

The first chip 100 may include the first semiconductor substrate 110, the first circuit wiring layer 120, the trench isolation layer 130, the color filters CF, the fence pattern 150, and the micro lens ML.

The first semiconductor substrate 110 may include a pixel array area APS, an optical black area OB, and a pad area PAD when viewed in the plane. The pixel array area APS may be disposed at a center of the first semiconductor substrate 110 when viewed in the plane. The pixel array area APS may include the plural pixels.

The pixels may output a photoelectric signal in response to the incident light. The pixels may be arranged in the two-dimensional array along rows and columns. The rows may be substantially parallel to a first direction D1, and the columns may be substantially parallel to a second direction D2. In the following descriptions, the first direction D1 may be substantially parallel to the first surface 110*a* of the first semiconductor substrate 110.

The pad area PAD may be an edge area of the first semiconductor substrate 110. As an example, the pad area PAD of the first semiconductor substrate 110 may be defined between the pixel array area APS and a side surface of the first semiconductor substrate 110 when viewed in the plane. The pad area PAD may surround the pixel array area APS when viewed in the plane. Bonding pads 193 may be provided in the pad area PAD. The bonding pads 193 may output electrical signals generated by the pixels to the outside. According to an embodiment, the electrical signals or voltages from the outside may be applied to the pixels via the bonding pads 193. Because the pad area PAD is the edge area of the first semiconductor substrate 110, the bonding pads 193 may be easily connected to external components.

Hereinafter, the pixel array area APS of the first chip 100 of the image sensor will be described in detail, and descriptions will be focused on different features from the above-described embodiments.

The first semiconductor substrate 110 may include the first surface 110*a* and the second surface 110*b*, which are opposite to each other. The first semiconductor substrate 110 may include the pixels formed therein. The first semiconductor substrate 110 may include the photoelectric conversion element PD defined therein to correspond to the pixels, respectively.

The trench isolation layer 130 may be disposed in the first semiconductor substrate 110 to define the plural pixels. The trench isolation layer 130 may be disposed in the trench 130*t* penetrating the first surface 110*a* and the second surface 110*b* of the first semiconductor substrate 110.

The trench isolation layer 130 may include the first conductive isolation layer 131*a* extending from the first surface 110*a* to the second surface 110*b*, the insulation liner 133 disposed between the first conductive isolation layer 131*a* and the first semiconductor substrate 110, and the second conductive isolation layer 131*b* extending in the direction from the second surface 110*b* toward the first surface 110*a* and being in contact with the first conductive isolation layer 131*a*.

The first conductive isolation layer 131*a* may be filled in the trench 130*t* penetrating the first surface 110*a* and the second surface 110*b* of first the semiconductor substrate 110. The insulation liner 133 may be provided along the sidewall of the trench 130*t*. The insulation liner 133 may be disposed between first the semiconductor substrate 110 and the first conductive isolation layer 131*a* and may electrically insulate the second conductive isolation layer 131*b* from first the semiconductor substrate 110.

The second conductive isolation layer 131*b* may be provided in the trench 130*t* in which the first conductive isolation layer 131*a* and the insulation liner 133 are formed. The second conductive isolation layer 131*b* may cover the side surface of the insulation liner 133 and the upper surface of the first conductive isolation layer 131*a* in the trench 130*t* from which the first conductive isolation layer 131*a* is removed, and thus, the lower surface of the second conductive isolation layer 131*b* may be directly in contact with the upper surface of the first conductive isolation layer 131*a*.

The second conductive isolation layer 131*b* may include the transparent conductive material.

The negative bias voltage may be applied to the first conductive isolation layer 131*a* and the second conductive isolation layer 131*b*.

The color filters CF may be disposed at every pixel on the second surface 110*b* of the first semiconductor substrate 110. The fence pattern 150 may be disposed on the trench isolation layer 130. The upper insulating layer 140 may be disposed between the first semiconductor substrate 110 and the color filters CF and between the trench isolation layer 130 and the fence pattern 150.

A first protective layer 160 may conformally cover an upper surface of the upper insulating layer 140, a sidewall of the fence pattern 150, and an upper surface of the fence pattern 150. As an example, the upper insulating layer 140 disposed on the sidewall of the fence pattern 150 may have substantially the same thickness as a thickness of the upper insulating layer 140 disposed on the upper surface of the fence pattern 150. The first protective layer 160 may include a high dielectric material and may have insulating characteristics. As an example, the first protective layer 160 may include aluminum oxide or hafnium oxide. The first protective layer 160 may protect the photoelectric conversion element PD of the first semiconductor substrate 110 from an external environment.

A second protective layer 170 may include an organic material and/or an inorganic material. According to an embodiment, the second protective layer 170 may include a silicon-containing material, such as silicon oxide, silicon nitride, silicon oxynitride, silicon carbide, silicon carbide oxide, silicon carbide nitride, and/or silicon carbide oxynitride. According to an embodiment, the second protective layer 170 may include aluminum oxide, zinc oxide, and/or hafnium oxide. The second protective layer 170 may have insulating characteristics, however, it should not be limited thereto or thereby. According to an embodiment, the second protective layer 170 may transmit the light.

The first circuit wiring layer 120 may be provided on the first surface 110*a* of the first semiconductor substrate 110. The first circuit wiring layer 120 may include a first circuit part 121 including a gate pattern 121*a* and a gate insulation pattern 121*b*.

Impurity regions and a shallow trench isolation layer may be provided in the first circuit part 121.

The impurity regions may be respectively disposed in the pixels of the first semiconductor substrate 110. The impurity regions may be disposed adjacent to the first surface 110*a* of the first semiconductor substrate 110. The impurity regions may be spaced apart from the photoelectric conversion element PD. The impurity regions may be doped with the second conductive type impurity, e.g., the n-type impurity. The impurity regions may be active regions. In this case, the active regions may be areas for an operation of the transistor and may include the floating diffusion region FD and source/drain areas of the transistor. The transistor may include the transfer transistor, the source-follower transistor, the reset transistor, or the selection transistor.

The shallow trench isolation layer may be provided in the first semiconductor substrate 110. The shallow trench isolation layer may define the active regions. In detail, the shallow trench isolation layer may define the impurity regions in each pixel, and the impurity regions may be separated from each other by the shallow trench isolation layer.

The gate pattern 121*a* may be disposed on the first surface 110*a* of the first semiconductor substrate 110. The gate pattern 121*a* may serve as a gate electrode of the transfer transistor, the source-follower transistor, the reset transistor, or the selection transistor. As an example, the gate pattern 121*a* may include a transfer gate, a source-follower gate, a reset gate, or a selection gate. For the convenience of explanation, FIGS. 9A and 9B show the structure in which one gate pattern 121*a* is disposed in each pixel, however, the present disclosure should not be limited thereto or thereby. According to an embodiment, a plurality of gate patterns 121*a* may be disposed in each pixel.

The gate pattern 121*a* may have a buried-gate structure. As an example, the gate pattern 121*a* may include a first portion and a second portion. The first portion of the gate pattern 121*a* may be disposed on the first surface 110*a* of the first semiconductor substrate 110. The second portion of the gate pattern 121*a* may protrude into the first semiconductor substrate 110. The second portion of the gate pattern 121*a* may be disposed on an upper surface of the first portion and may be connected to the first portion. Different from the structure shown in FIGS. 9A and 9B, the gate pattern 121*a* may have a planar gate structure. In this case, the gate pattern 121*a* may not include the second portion. The gate pattern 121*a* may include a metal material, a metal silicide material, polysilicon, and a combination thereof. In this case, polysilicon may include a doped polysilicon.

The gate insulation pattern 121*b* may be disposed between the gate pattern 121*a* and the first semiconductor substrate 110. The gate insulation pattern 121*b* may include a silicon-based insulating material, such as silicon oxide, silicon nitride, and/or silicon oxynitride, and/or a high dielectric material, such as hafnium oxide and/or aluminum oxide.

In addition, the first circuit wiring layer 120 may further include a first lower insulating layer 123 and a first wiring structure 125. The first lower insulating layer 123 may cover the first surface 110*a* of the first semiconductor substrate 110 and may be provided in plural. The first lower insulating layers 123 may include a silicon-based insulating material such as silicon oxide, silicon nitride, and/or silicon oxynitride.

The first wiring structure 125 may be provided in the stacked first lower insulating layers 123. The first wiring structure 125 may include a wiring portion and a via portion. The wiring portion may be provided in the first lower insulating layer 123 and may be electrically connected to one of the impurity regions and the gate pattern 121*a*. In addition, the wiring portion may be disposed between two lower insulating layers adjacent to each other. The via portion of the first wiring structure 125 may penetrate at least one of the first lower insulating layers 123 and may be connected to the wiring portion. The first wiring structure 125 may receive the photoelectric signal output from the photoelectric conversion element PD.

Hereinafter, the optical black area OB and the pad area PAD will be described in detail.

The optical black area OB of the first semiconductor substrate 110 may be disposed between the pixel array area APS and the pad area PAD. Similar to the pixel array area APS, the optical black area OB may include a portion where the photoelectric conversion element PD is provided and a portion where the photoelectric conversion element PD is not provided. The impurity regions, the gate pattern 121*a*, and the shallow trench isolation layer may be disposed in each pixel in the optical black area.

The upper insulating layer 140 may extend onto the optical black area OB and the pad area PAD of the first semiconductor substrate 110 and may cover the second surface 110*b* of the first semiconductor substrate 110.

A light blocking layer 187 and an organic insulating layer 181 may be disposed in the optical black area OB. The light blocking layer 187 may be disposed on the upper insulating layer 140. The light may not be incident to the photoelectric conversion element PD of the optical black area OB by the light blocking layer 187. The pixels of the optical black area OB may not output the photoelectric signal and may output a noise signal. The noise signal may be generated by electrons caused by heat or the dark current. Differently, the light blocking layer 187 may not cover the pixel array area APS, and the light may be incident to the photoelectric conversion element PD of the pixel array area APS. The light blocking layer 187 may include, for example, a metal material such as tungsten, copper, aluminum, or alloys thereof.

The organic insulating layer 181 may be disposed on the light blocking layer 187. The organic insulating layer 181 may be transparent. An upper surface of the organic insulating layer 181 may be substantially parallel to the upper surface of the first semiconductor substrate 110. The organic insulating layer 181 may include, for example, a polymer organic material, and may have insulating characteristics. The organic insulating layer 181 may include the same material as the fence patterns 150. According to an embodiment, the organic insulating layer 181 may include the same material as the micro lens ML. In this case, the organic insulating layer 181 may be connected to the micro lens ML, however, it should not be limited thereto or thereby.

The image sensor may further include at least one of a contact plug 195, a first conductive pattern 191*a*, a protective insulating layer 183, and a filtering layer 185.

The first conductive pattern 191*a* may be provided in the optical black area OB and the pad area PAD of the second surface 110*b* of the first semiconductor substrate 110. The first conductive pattern 191*a* may be disposed between the upper insulating layer 140 and the light blocking layer 187. The first conductive pattern 191*a* may serve as a barrier layer or an adhesive layer. The first conductive pattern 191*a* may include metal and/or metal nitride. As an example, the first conductive pattern 191*a* may include titanium and/or titanium nitride. The first conductive pattern 191*a* may not extend onto the pixel array area APS of the first semiconductor substrate 110.

The contact plug 195 may be disposed on an upper surface of an outermost portion of the trench isolation layer 130. The contact plug 195 may be provided in the trench formed in the second surface 110*b* of the first semiconductor substrate 110. The contact plug 195 may include a different material from the light blocking layer 187. As an example, the contact plug 195 may include a metal material such as aluminum. The first conductive pattern 191*a* may extend to between the contact plug 195 and the insulating layer and between the contact plug 195 and the trench isolation layer 130. The contact plug 195 may be electrically connected to the trench isolation layer 130 through the first conductive pattern 191*a*. Accordingly, the negative bias voltage may be applied to the trench isolation layer 130 through the contact plug 195.

The filtering layer 185 may be disposed between the light blocking layer 187 and the organic insulating layer 181. The filtering layer 185 may block a light having a wavelength different from that of a light blocked by the color filters CF. As an example, the filtering layer 185 may block an infrared light. The filtering layer 185 may include a blue color filter, however, it should not be limited thereto or thereby.

The protective insulating layer 183 may be disposed between the light blocking layer 187 and the filtering layer 185. The protective insulating layer 183 may cover an upper surface of the light blocking layer 187 and an upper surface of the contact plug 195. The protective insulating layer 183 may include the same material as the first protective layer 160 and may be connected to the first protective layer 160. The protective insulating layer 183 may be formed integrally with the first protective layer 160. According to an embodiment, the protective insulating layer 183 may be formed through a separate process from the first protective layer 160 and may be spaced apart from the first protective layer 160. The protective insulating layer 183 may include a high dielectric material, such as aluminum oxide and/or hafnium oxide.

The first circuit wiring layer 120 may be disposed on the first surface 110*a* of the first semiconductor substrate 110 and may extend to the optical black area OB and the pad area PAD of the first semiconductor substrate 110.

The second chip 200 may be disposed under the first chip 100, and the adhesive portion 300 may be disposed between the first chip 100 and the second chip 200.

The second chip 200 may include a logic circuit mounted thereon. The second chip 200 may include the second circuit wiring layer 220 and the second semiconductor substrate 210.

The second semiconductor substrate 210 may include a third surface 210*a* and a fourth surface 210*b* opposite to the third surface 210*a*. The third surface 210*a* of the second semiconductor substrate 210 may be opposite to the first surface 110*a* of the first semiconductor substrate 110, and the fourth surface 210*b* may be opposite to the third surface 210*a*.

The second circuit wiring layer 220 may be disposed on the fourth surface 210*b*. That is, the second circuit wiring layer 220 may be disposed between the first circuit wiring layer 120 and the second semiconductor substrate 210 and may include a second circuit part 221, a second lower insulating layer 223, and a second wiring structure 225.

The second circuit part 221 second circuit part 221 may include integrated circuits and may be disposed on the upper surface of the second semiconductor substrate 210 or in the second semiconductor substrate 210. The integrated circuits may include logic circuits, memory circuits, or a combination thereof. The integrated circuits may include, for example, transistors.

Each of the second wiring structures 225 may include a wiring pattern and a via pattern. The wiring pattern may be disposed between the second lower insulating layers 223. The via pattern may be disposed in the second lower insulating layers 223. The second wiring structures 225 may be electrically connected to the integrated circuits. The second wiring structures 225 may include metal.

A connection part for connecting to the outside and electrically connecting the first chip 100 and/or the second chip 200 may be provided in the pad area PAD. To this end, a bonding pad 193 and first and second through holes 197 and 199 may be provided to the connection part.

The bonding pad 193 may be disposed in the pad area PAD of the first surface 110*a* of the first semiconductor substrate 110. The bonding pad 193 may be buried in the first semiconductor substrate 110. As an example, a pad trench may be formed in the pad area PAD of the first surface 110*a* of the first semiconductor substrate 110, and the bonding pad 193 may be disposed in the pad trench. The bonding pad 193 may include metals such as aluminum, copper, tungsten, titanium, tantalum, or alloys thereof. A bonding wire may be formed on the bonding pad 193 in a process of mounting the image sensor and may be connected to the bonding pad 193. The bonding pad 193 may be electrically connected to external devices through the bonding wire.

The first through hole 197 may be defined adjacent to one side of the bonding pad 193. The first through hole 197 may be defined between the bonding pad 193 and the contact plug 195. The first through hole 197 may penetrate the upper insulating layer 140, the first semiconductor substrate 110, and the first circuit wiring layer 120. The first through hole 197 may further penetrate at least a portion of the second circuit wiring layer 220. The first through hole 197 may include a first bottom surface and a second bottom surface. The first bottom surface of the first through hole 197 may expose the first wiring structure 125. The second bottom surface of the first through hole 197 may be disposed at a position lower than the first bottom surface. The second bottom surface of the first through hole 197 may expose the second wiring structure 225.

The first conductive pattern 191*a* may overlap the pad area PAD of the first semiconductor substrate 110 and may be disposed on the upper insulating layer 140. The first conductive pattern 191*a* may cover an inner sidewall of the first through hole 197. The bonding pad 193 may be provided in plural.

The bonding pads 193 may include a first bonding pad and a second bonding pad. The first conductive pattern 191*a* may be disposed on a lower surface and a sidewall of one bonding pad, e.g., the first bonding pad, of the bonding pads and may be electrically connected to the one bonding pad, e.g., the first bonding pad. The first conductive pattern 191*a* may cover a sidewall and the first bottom surface of the first through hole 197. The first conductive pattern 191*a* may be in contact with an upper surface of the first wiring structure 125. Accordingly, the first wiring structure 125 may be electrically connected to the one bonding pad, e.g., the first bonding pad, through the first conductive pattern 191*a*. When the image sensor operates, a voltage may be applied to the first wiring structure 125 via the one bonding pad and the first conductive pattern 191*a*. The voltage may be applied to the insulation liner 133 via the first conductive pattern 191*a* and the contact plug 195. The voltage may be the negative bias voltage.

The first conductive pattern 191*a* may cover the second bottom surface of the first through hole 197 and may be connected to an upper surface of the second wiring structure 225. The integrated circuits of the second chip 200 may be electrically connected to the one bonding pad 193 through the second wiring structure 225 and the first conductive pattern 191*a*. Each of the first conductive pattern 191*a* and the first through hole 197 may be provided in plural. In this case, another first conductive pattern of the first conductive patterns 191*a* may not be connected to the contact plug 195 and may be connected to the first wiring structure 125 or the second wiring structure 225. The another first conductive pattern 191*a* may serve as an electrical passage between the integrated circuits of the second chip 200 and the transistors of the first chip 100. The first conductive patterns 191*a* may include metals such as copper, tungsten, aluminum, titanium, tantalum, or alloys thereof. Hereinafter, one first conductive pattern 191*a* will be described in detail.

The image sensor may further include at least one of a first buried pattern 197*a* and a first capping pattern 197*b*. The first buried pattern 197*a* and the first capping pattern 197*b* may be disposed in the pad area PAD of the first semiconductor substrate 110. The first buried pattern 197*a* may be disposed in the first through hole 197 and may cover the first conductive pattern 191*a*. The first buried pattern 197*a* may fill at least a portion of the first through hole 197. The first buried pattern 197*a* may not extend onto the second surface 110*b* of the first semiconductor substrate 110. The first buried pattern 197*a* may include a low-refractive-index material and may have insulating characteristics. The first buried pattern 197*a* may include the same material as the fence pattern 150. As an example, the first buried pattern 197*a* may include polymer and silica nanoparticles. An upper surface of the first buried pattern 197*a* may be concave. As an example, a center portion of the upper surface of the first buried pattern 197*a* may be disposed at a position lower than an edge portion of the upper surface of the first buried pattern 197*a*.

The first capping pattern 197*b* may be disposed on the upper surface of the first buried pattern 197*a*. An upper surface of the first capping pattern 197*b* may be substantially flat. The upper surface of the first capping pattern 197*b* may be covered by the filtering layer 185. The first capping pattern 197*b* may include an insulating polymer such as a photoresist material.

The second through hole 199 may be disposed adjacent to the other side of the bonding pad 193. The second through hole 199 may penetrate the insulating layer, the first semiconductor substrate 110, and the first circuit wiring layer 120. The second through hole 199 may further penetrate a portion of the second circuit wiring layer 220 and may expose the second wiring structure 225.

The image sensor may further include a second conductive pattern 191*b*, a second buried pattern 199*a*, and a second capping pattern 199*b*. The second conductive pattern 191*b* may be disposed on the second surface 110*b* of the first semiconductor substrate 110. The second conductive pattern 191*b* may be disposed between the other bonding pad, e.g., the second bonding pad 193, of the bonding pads 193 and the first semiconductor substrate 110 as shown in FIGS. 9A and 9B and may be electrically connected to the other bonding pad 193. The second conductive pattern 191*b* may extend into the second through hole 199 and may conformally cover a sidewall and a bottom surface of the second through hole 199. The second conductive pattern 191*b* may be electrically connected to the second wiring structure 225. When the image sensor operates, the integrated circuits of the second chip 200 may transmit and receive an electrical signal through the second wiring structure 225, the second conductive pattern 191*b*, and the other bonding pad 193, e.g., the second bonding pad 193.

The second buried pattern 199*a* may be provided in the second through hole 199 and may be filled in the second through hole 199. The second buried pattern 199*a* may not extend onto the second surface 110*b* of the first semiconductor substrate 110. The second buried pattern 199*a* may include a low-refractive-index material and may have insulating characteristics. As an example, the second buried pattern 199*a* may include the same material as at least one of the fence pattern 150 and the first buried pattern 197*a*. An upper surface of the second buried pattern 199*a* may be concave.

The second capping pattern 199*b* may be disposed on the upper surface of the second buried pattern 199*a*. An upper surface of the second capping pattern 199*b* may be substantially flat. The second capping pattern 199*b* may include an insulating polymer such as a photoresist material.

The protective insulating layer 183 may extend onto the pad area PAD of the first semiconductor substrate 110 and may cover the first conductive pattern 191*a* and the second conductive pattern 191*b*. The protective insulating layer 183 may extend into the first through hole 197 and the second through hole 199. The protective insulating layer 183 may be disposed between the first conductive pattern 191*a* and the first buried pattern 197*a* in the first through hole 197. The protective insulating layer 183 may be disposed between the second conductive pattern 191*b* and the second buried pattern 199*a* in the second through hole 199. The protective insulating layer 183 may expose the bonding pad 193.

The organic insulating layer 181 may be disposed in the pad area PAD of the first semiconductor substrate 110. The organic insulating layer 181 may cover a portion of the protective insulating layer 183, the first capping pattern

197*b*, and the second capping pattern 199*b*. The organic insulating layer 181 may expose an upper surface of the bonding pad 193.

The second protective layer 170 may extend onto the optical black area OB and the pad area PAD of the first semiconductor substrate 110 and may cover the organic insulating layer 181.

The image sensor having the above-described structure may be manufactured by the following method.

FIGS. 10A to 10G are cross-sectional views sequentially illustrating a method of manufacturing the image sensor according to an example embodiment, and the manufacturing method of the image sensor having the structure shown in FIGS. 9A and 9B will be described as an example, however, the manufacturing method of the image sensor may be changed in various ways as long as it does not depart from the concept of the present disclosure.

Figure 10A:
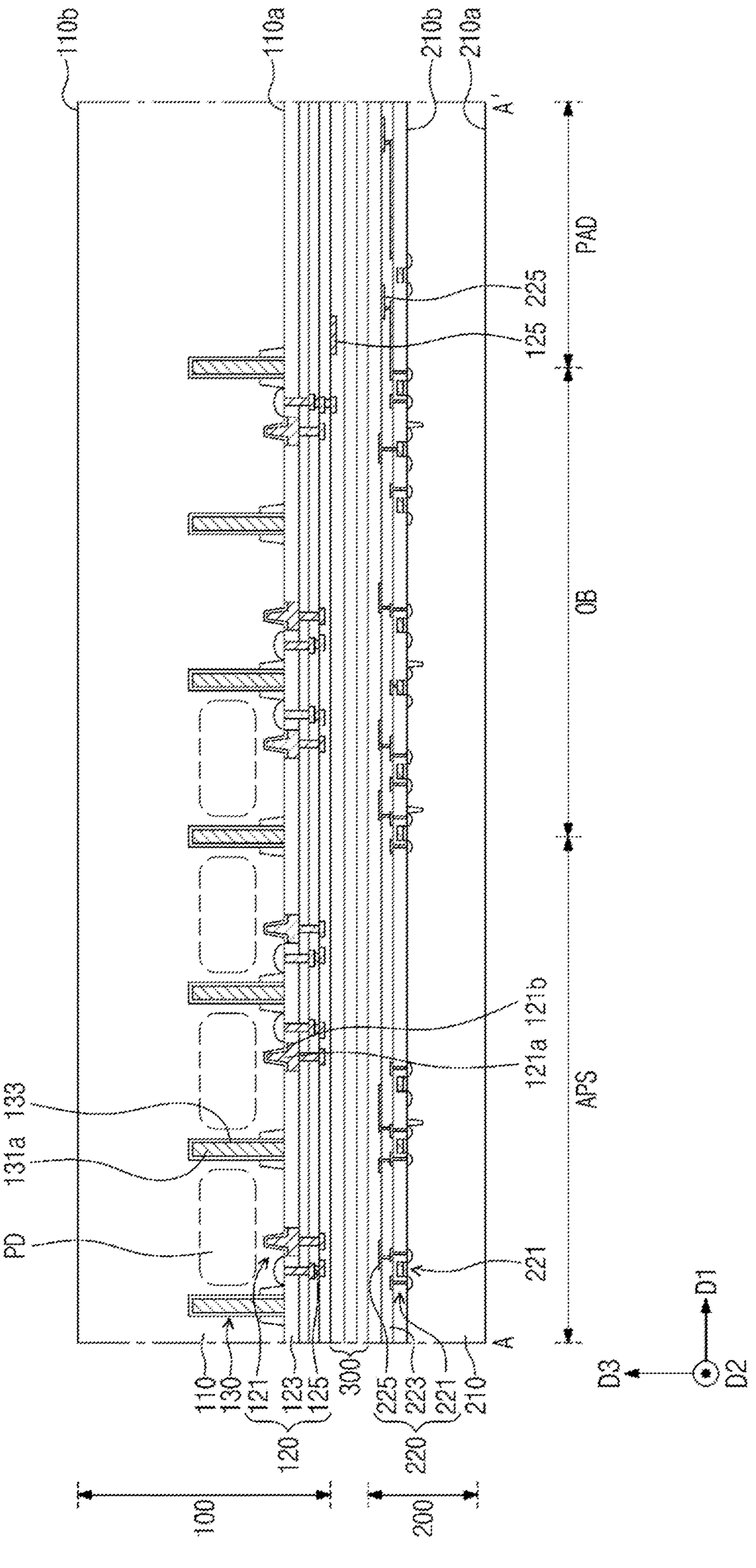
FIGS. 10A to 10G are cross-sectional views sequentially illustrating a method of manufacturing an image sensor according to an example embodiment.

Referring to FIG. 10A, the first chip 100 that is the sensor chip and the second chip 200 are coupled with each other with the adhesive portion 300 interposed therebetween. In this case, a portion of the pixel is formed in the first chip 100.

The first semiconductor substrate 110 is prepared, and some components of the pixel are formed on the first surface 110*a* of the first semiconductor substrate 110 to form the first chip 100. In this process, the first circuit wiring layer 120 and the trench isolation layer 130 are formed on the first surface 110*a* of the first semiconductor substrate 110. The trench isolation layer 130 is formed by forming the trench 130*t* recessed from the first surface 110*a* and forming the first conductive isolation layer 131*a* and the insulation liner 133 in the trench 130*t*. In this case, the trench 130*t* may have a recess shape recessed from the upper surface of the first semiconductor substrate 110 by a predetermined depth, and the first conductive isolation layer 131*a* and the insulation liner 133 are formed in the trench 130*t*. The trench isolation layer 130 is formed by forming the trench 130*t* in the direction from the first surface 110*a* toward the second surface 110*b*, conformally forming the insulation liner 133 in the trench 130*t*, and filling a material for the first conductive isolation layer 131*a* in the trench 130*t*. The first circuit wiring layer 120 is formed on the first surface 110*a* of the first semiconductor substrate 110. The first circuit wiring layer 120 may include the gate pattern 121*a*, the gate insulation pattern 121*b*, the impurity region, and the shallow trench isolation layer. The first circuit wiring layer 120 is formed by forming the first circuit part 121 and forming the first lower insulating layers 123 and the first wiring structure 125 on the first circuit part 121. The second chip 200 is prepared separately from the first chip 100. The second chip 200 is formed by preparing the second semiconductor substrate 210 and forming the second circuit wiring layer 220 on the second semiconductor substrate 210. The second semiconductor substrate 210 includes the third surface 210*a* and the fourth surface 210*b* opposite to the third surface 210*a*, and the second circuit wiring layer 220 is formed on the fourth surface 210*b*. The second circuit wiring layer 220 is formed by forming the second circuit part 221 including the transistor and forming the second lower insulating layers 223 and the second wiring structure 225 on the second circuit part 220. The first chip 100 and the second chip 200 are attached to each other by arranging the first surface 110*a* and the fourth surface 210*b* to face each other and performing the annealing process on the first surface 110*a* and the fourth surface 210*b*, and thus, the first chip 100 and the second chip 200 are connected integrally to each other.

Figure 10B:
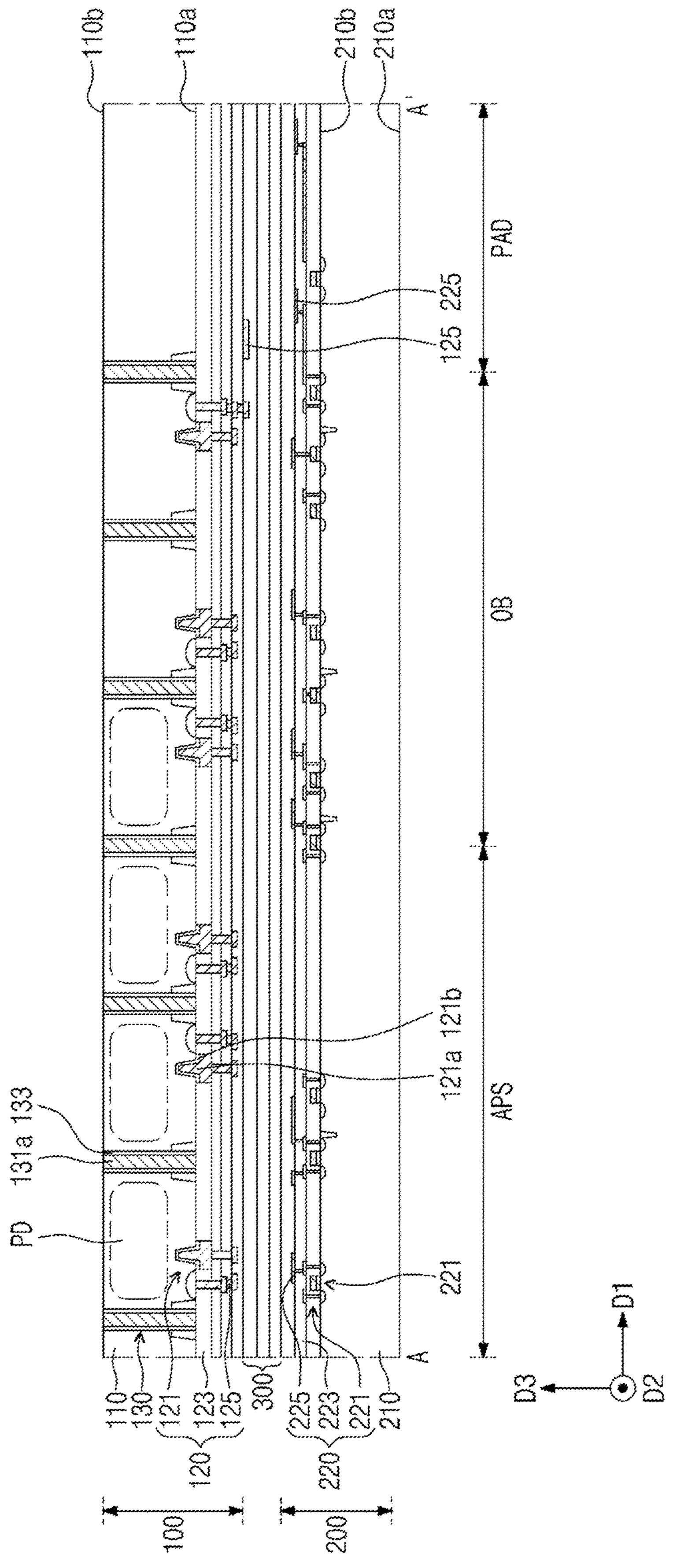

Referring to FIG. 10B, a portion of a rear surface of the first chip 100, that is, a portion of the first semiconductor substrate 110 corresponding to the second surface 110*b*, may be removed. The portion of the first semiconductor substrate 110 may be removed by the chemical mechanical polishing process. The chemical mechanical polishing process may be performed until the trench isolation layer 130 penetrates both surfaces of the first semiconductor substrate 110, in other words, until the first conductive isolation layer 131*a* and the insulation liner 133 are exposed to the outside. The polished semiconductor substrate 110 may be subjected to the hydrogen/deuterium annealing process to heal defects in the semiconductor substrate 110, for example, dangling bonds.

Figure 10C:
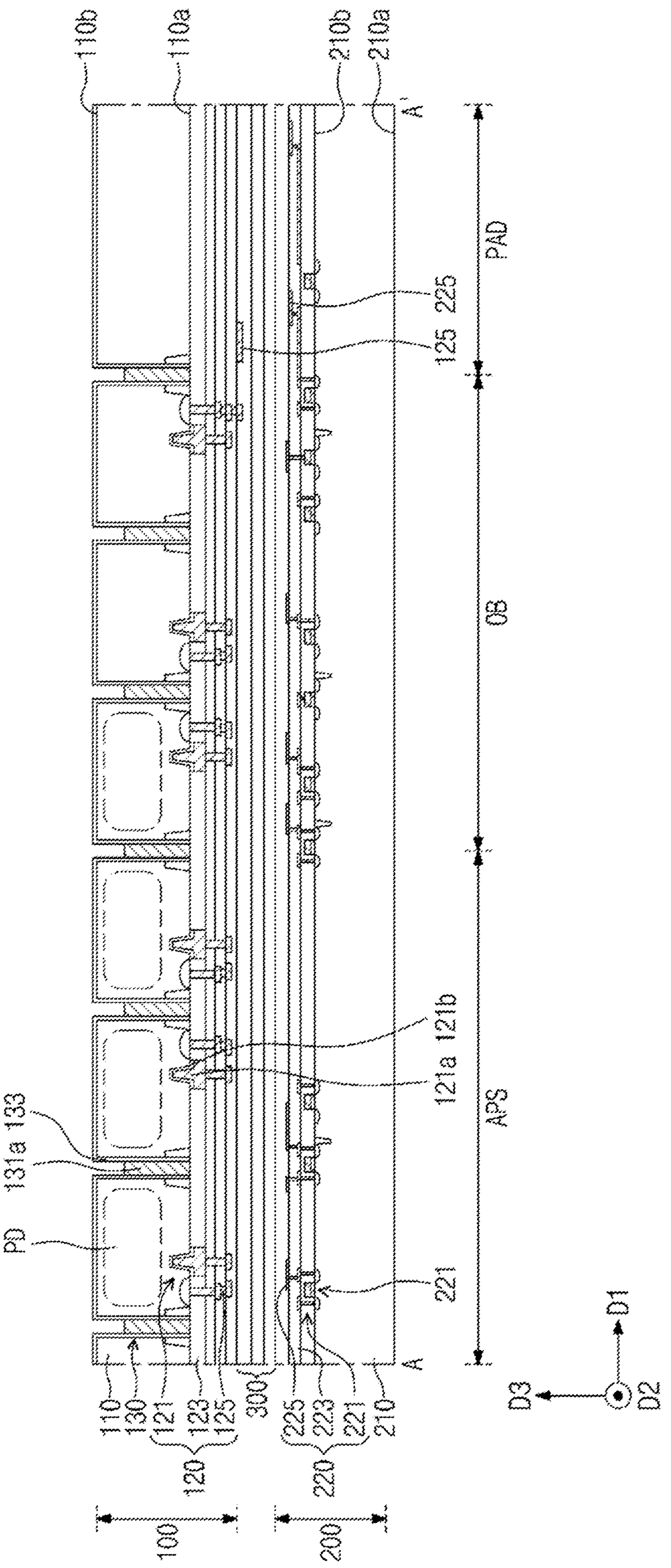

Referring to FIG. 10C, as the insulating layer is formed on the second surface 110*b* of the semiconductor substrate 110 and the insulating layer is patterned, the portions of the insulating layer formed on the first conductive isolation layer 131*a* may be removed. Then, the first conductive isolation layer 131*a* is removed between the second surface 110*b* and the predetermined depth by the ashing process.

Figure 10D:
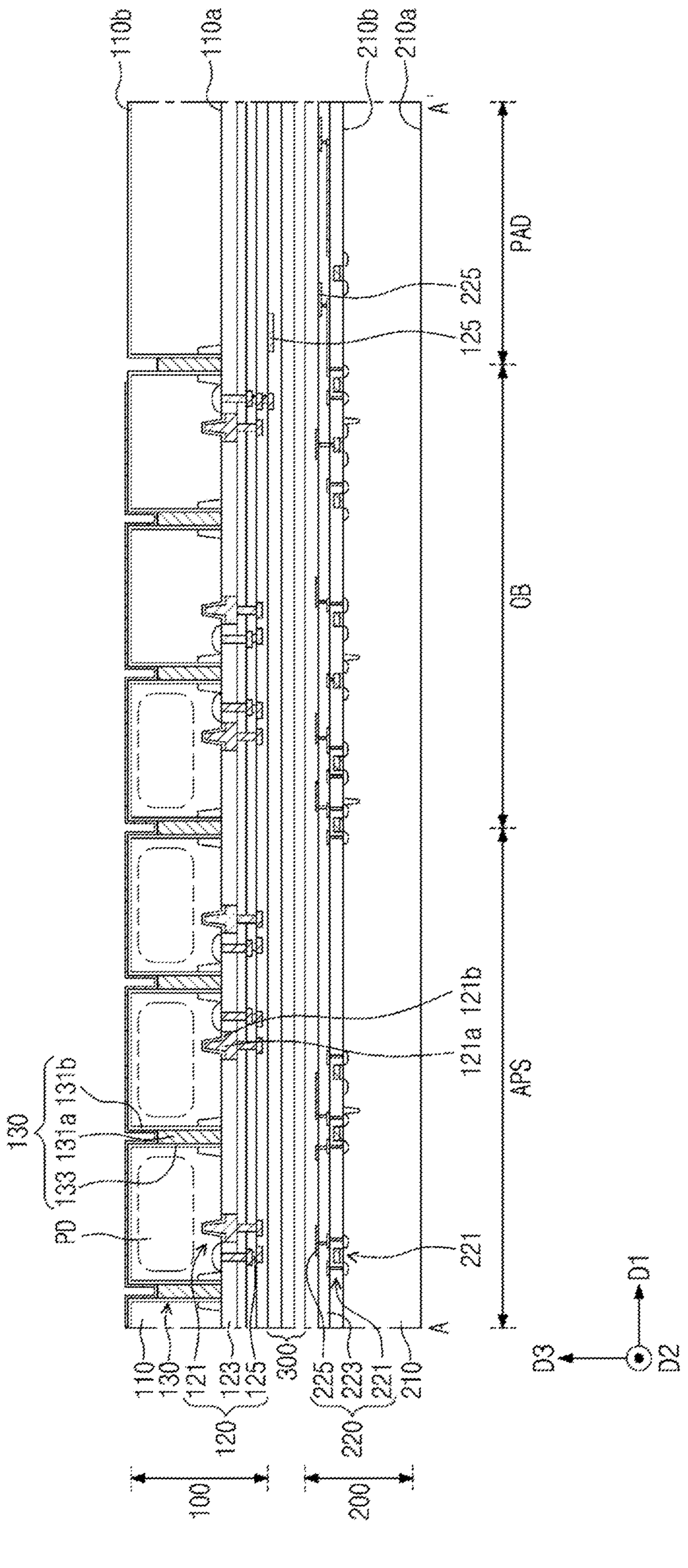

Referring to FIG. 10D, the second conductive isolation layer 131*b* is formed on the first conductive isolation layer 131*a* removed to the predetermined depth. The second conductive isolation layer 131*b* is formed in the trench 130*t* from which the first conductive isolation layer 131*a* is removed and on the second surface 110*b* of the semiconductor substrate 110.

According to the embodiments of the present disclosure, the second conductive isolation layer 131*b* is formed using the transparent conductive material, such as a transparent conductive oxide, a metal grid, a random metal network, a carbon nanotube, a graphene, a nanowire mesh, an ultra-thin metal film, a conductive polymer, and the like. After the manufacturing of the second conductive isolation layer 131*b*, there may not be a high-temperature process of about 300 degrees or more in the manufacturing process of the image sensor, and thus, a degree of freedom in selecting the transparent conductive material may be high.

Figure 10E:
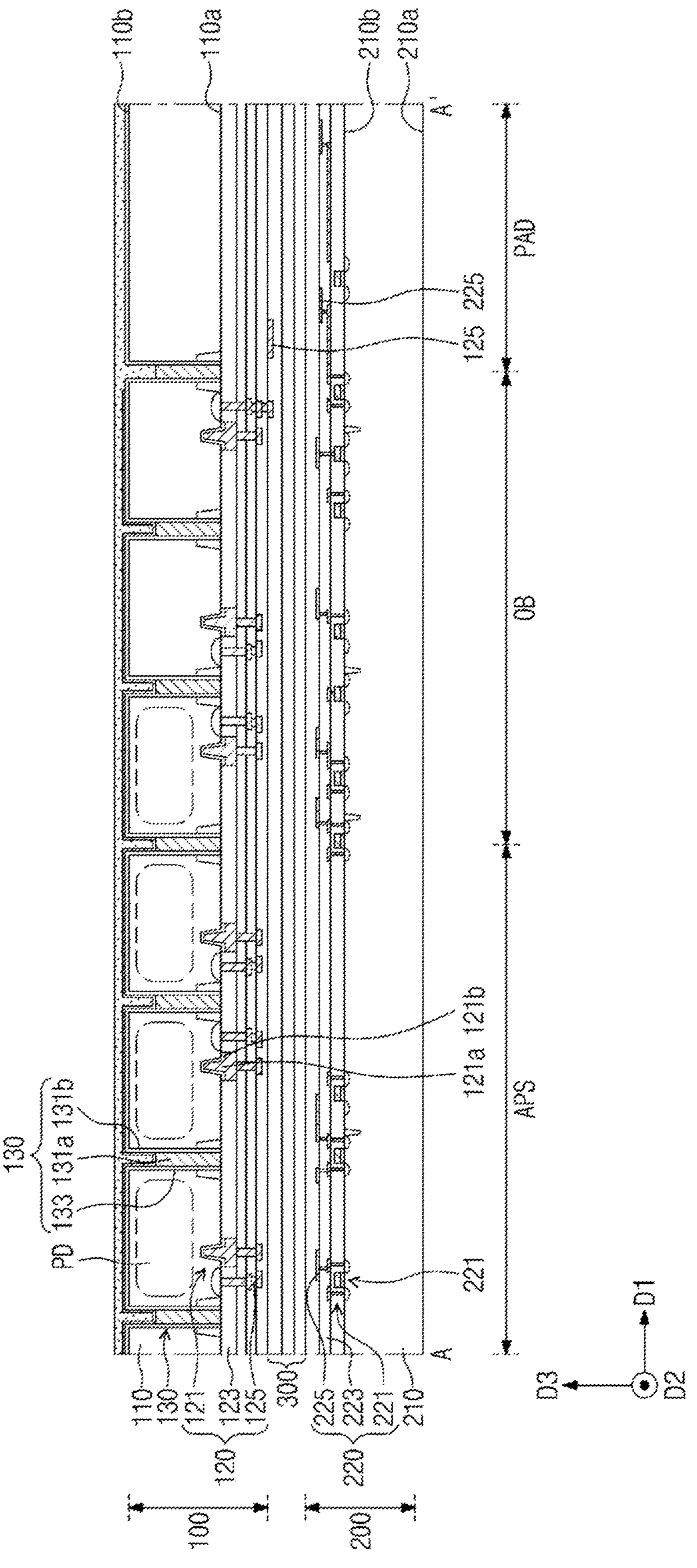

Referring to FIG. 10E, the upper insulating layer 140 is formed on the semiconductor substrate 110 on which the second conductive isolation layer 131*b* is formed, and the portion of the upper insulating layer 140 may be filled in the trench 130*t*.

Figure 10F:
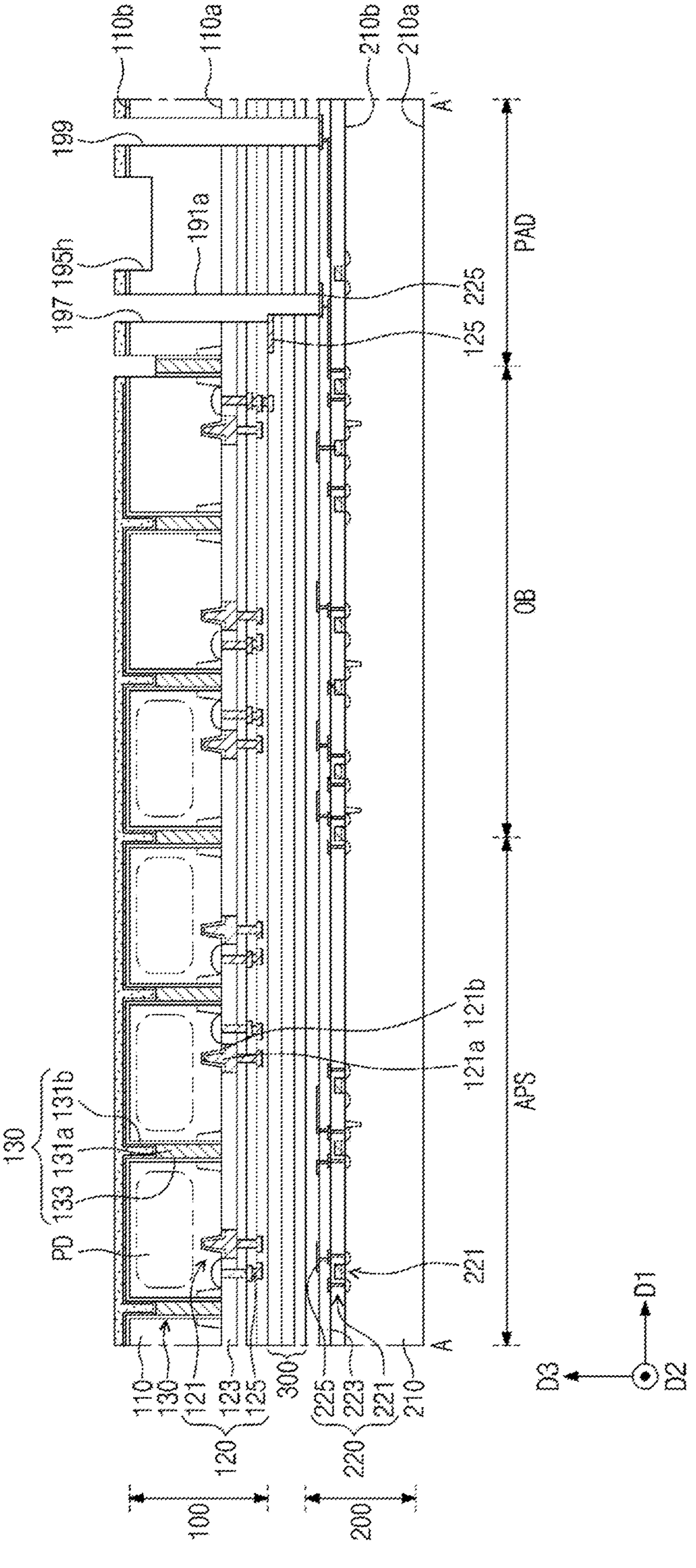

Referring to FIG. 10F, the other components of the pixel are formed in the semiconductor substrate 110 on which the second conductive isolation layer 131*b* is formed. As an example, a contact trench for the contact plug 195 and the first and second through holes 197 and 199 are formed.

Figure 10G:
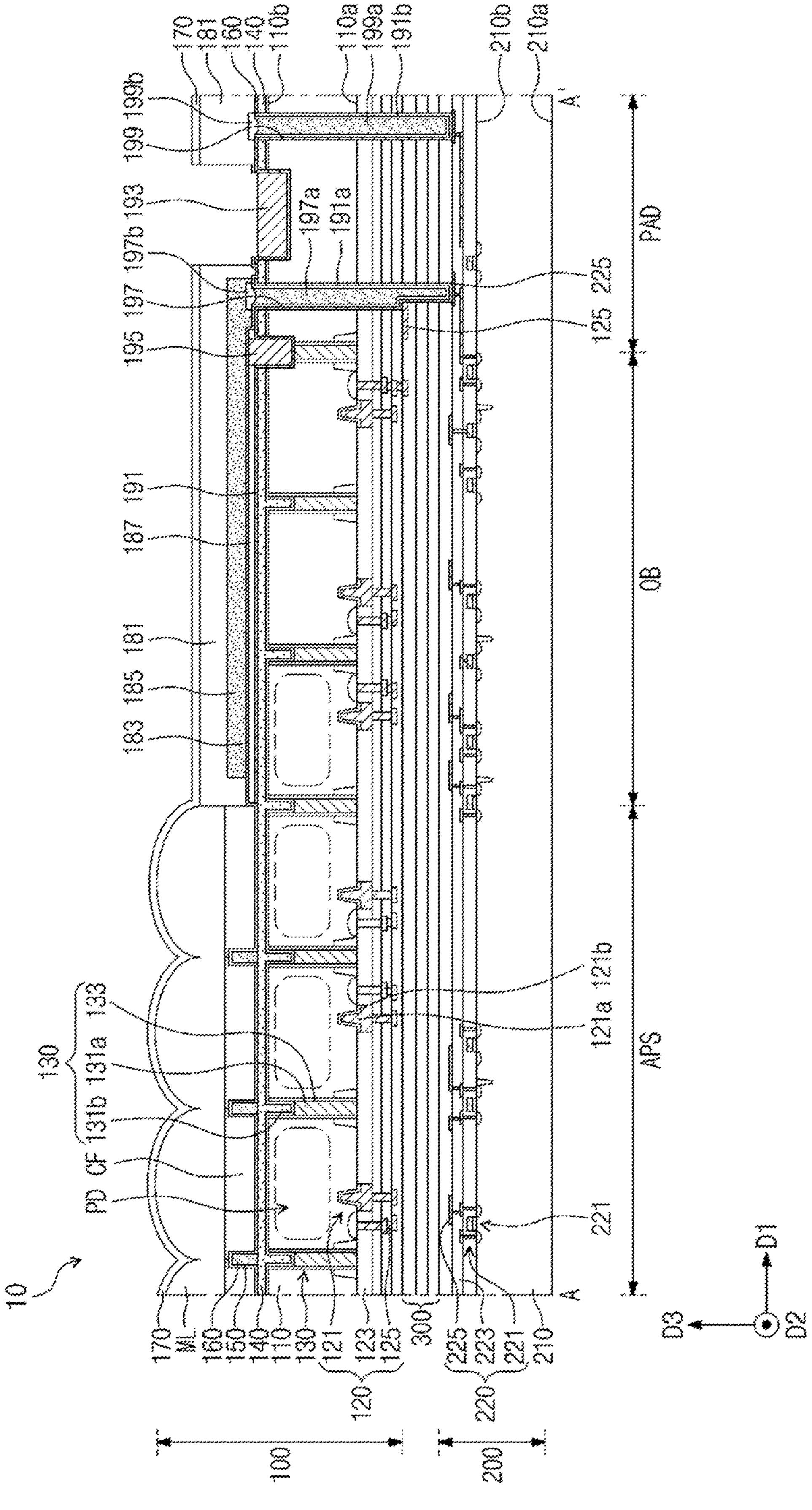

Referring to FIG. 10G, the color filter CF, the micro lens ML, the bonding pad 193, and the contact plug 195 are formed on the semiconductor substrate 110 in which the upper insulating layer 140, the contact trench, and the first and second through holes 197 and 199 are formed, and thus, the image sensor is completed.

Although the embodiments of the present disclosure have been described, it is understood that the present disclosure should not be limited to these embodiments but various changes and modifications can be made by one ordinary skilled in the art within the spirit and scope of the present disclosure as hereinafter claimed.

Therefore, the disclosed subject matter should not be limited to any embodiment described herein, and the scope of the present inventive concept shall be determined according to the attached claims.

What is claimed is:

1. An image sensor comprising:

a semiconductor substrate comprising pixels, a first surface, and a second surface opposite to the first surface;

first and second photodiodes in the semiconductor substrate;

a trench penetrating the first surface and the second surface of the semiconductor substrate, and separating the first and second photodiodes from each other;

a micro lens disposed on the second surface;

a first conductive isolation layer in the trench;

a second conductive isolation layer in the trench and disposed between the second surface and the first conductive isolation layer; and an insulation liner disposed between a sidewall of the trench and both of the first conductive isolation layer and the second conductive isolation layer, wherein the insulation liner is disposed on the second surface and covers surfaces of the first and second photodiodes, and wherein a width of a lower surface of the second conductive isolation layer in a first direction parallel to the second surface is different from a width of an upper surface of the first conductive isolation layer in the first direction.

2. The image sensor of claim 1, further comprising an upper insulating layer filling the trench and disposed on a sidewall of the second conductive isolation layer in a cross sectional view.

3. The image sensor of claim 2, wherein the second conductive isolation layer is disposed between the second surface and a point spaced apart from the second surface by a predetermined depth, the first conductive isolation layer is disposed between the first surface and the point corresponding to the predetermined depth, and the first conductive isolation layer has a length longer than a length of the second conductive isolation layer.

4. The image sensor of claim 3, wherein the lower surface of the second conductive isolation layer faces the upper surface of the first conductive isolation layer, and wherein the lower surface of the second conductive isolation layer is not flat.

5. The image sensor of claim 4, wherein the lower surface of the second conductive isolation layer is in contact with the first conductive isolation layer.

6. The image sensor of claim 3, wherein the second conductive isolation layer is on the second surface.

7. The image sensor of claim 1, wherein the second conductive isolation layer comprises a transparent conductive material.

8. The image sensor of claim 7, wherein the transparent conductive material comprises at least one of a transparent conductive oxide, a metal grid, a random metal network, a carbon nanotube, a graphene, a nanowire mesh, an ultra-thin metal film, or a conductive polymer.

9. The image sensor of claim 8, wherein the second conductive isolation layer comprises the transparent conductive oxide, and the transparent conductive oxide comprises at least one of indium tin oxide (ITO), indium zinc oxide (IZO), aluminum-doped zinc oxide (AZO), indium gallium zinc oxide (IGZO), fluorine-doped tin oxide, or niobium-doped anatase.

10. The image sensor of claim 1, wherein a width of the trench on the first surface in the first direction is different from a width of the trench on the second surface in the first direction.

11. An image sensor comprising:

a semiconductor substrate comprising a first surface and a second surface opposite to the first surface;

first and second photodiodes in the semiconductor substrate;

a trench penetrating the first surface and the second surface of the semiconductor substrate, and separating the first and second photodiodes from each other;

a micro lens disposed on the second surface;

a first conductive isolation layer in the trench;

a second conductive isolation layer in the trench and disposed between the second surface and the first conductive isolation layer;

an insulation liner disposed between a sidewall of the trench and both of the first conductive isolation layer and the second conductive isolation layer; and an upper insulating layer filling the trench and disposed on a sidewall of the second conductive isolation layer, wherein the sidewall of the second conductive isolation layer is sloped in a cross-sectional view.

12. The image sensor of claim 11, wherein the insulation liner is disposed on the second surface and the second conductive isolation layer is disposed on the insulation liner.

13. The image sensor of claim 12, wherein the insulation liner comprises a plurality of liners.

14. The image sensor of claim 13, wherein the second conductive isolation layer comprises a conductive material.

15. The image sensor of claim 14, wherein a distance from the second surface to a lower surface of the second conductive isolation layer in a thickness direction of the semiconductor substrate is less than a distance from the first surface to the lower surface of the second conductive isolation layer in the thickness direction of the semiconductor substrate.

16. The image sensor of claim 15, wherein a width of the trench on the first surface in a first direction parallel to the first surface is different from a width of the trench on the second surface in the first direction.

17. The image sensor of claim 14, wherein the second conductive isolation layer comprises at least one of a transparent conductive oxide, a metal grid, a random metal network, a carbon nanotube, a graphene, a nanowire mesh, an ultra-thin metal film, or a conductive polymer.

18. The image sensor of claim 14, wherein the second conductive isolation layer comprises at least one of indium tin oxide (ITO), indium zinc oxide (IZO), aluminum-doped zinc oxide (AZO), indium gallium zinc oxide (IGZO), fluorine-doped tin oxide, or niobium-doped anatase.

19. The image sensor of claim 14, wherein a lower surface of the second conductive isolation layer is in contact with the first conductive isolation layer.

20. An image sensor comprising:

a semiconductor substrate comprising a first surface and a second surface opposite to the first surface;

first and second photodiodes in the semiconductor substrate;

a trench penetrating the first surface and the second surface of the semiconductor substrate, and separating the first and second photodiodes from each other;

a micro lens disposed on the second surface;

a first conductive isolation layer in the trench;

a second conductive isolation layer in the trench, vertically overlapping the first conductive isolation layer, and being electrically in contact with the first conductive isolation layer;

a plurality of insulation liners disposed between a sidewall of the trench and both of the first conductive isolation layer and the second conductive isolation layer;

an upper insulating layer filling the trench and disposed on a sidewall of the second conductive isolation layer, and wherein the plurality of insulation liners are disposed on the second surface and the second conductive isolation layer is disposed on the plurality of insulation liners.

* * * * *